United States Patent
Bentley et al.

(10) Patent No.: US 9,564,925 B1
(45) Date of Patent: Feb. 7, 2017

(54) PIPELINED ARCHITECTURE FOR ITERATIVE DECODING OF PRODUCT CODES

(71) Applicant: International Business Machines Corporation, Armonk, NY (US)

(72) Inventors: Steven R. Bentley, Tucson, AZ (US); Simeon Furrer, Altdorf (CH); Robert A. Hutchins, Tucson, AZ (US); Scott J. Schaffer, Tucson, AZ (US); Keisuke Tanaka, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/013,821

(22) Filed: Feb. 2, 2016

(51) Int. Cl.
*H03M 13/00* (2006.01)
*H03M 13/15* (2006.01)
*H03M 13/29* (2006.01)

(52) U.S. Cl.
CPC ......... *H03M 13/1555* (2013.01); *H03M 13/15* (2013.01); *H03M 13/152* (2013.01); *H03M 13/1515* (2013.01); *H03M 13/2948* (2013.01)

(58) Field of Classification Search
CPC ............... H03M 13/2987; H03M 13/2978; H03M 13/6569; H03M 13/2957; H03M 13/6561; H04L 1/0066; H04L 1/0051
See application file for complete search history.

(56) References Cited

U.S. PATENT DOCUMENTS

| | | | |
|---|---|---|---|
| 6,594,794 B1* | 7/2003 | De Marzi | G11B 20/1833 714/784 |
| 7,370,258 B2 | 5/2008 | Iancu et al. | |
| 9,287,900 B2 | 3/2016 | Cideciyan | |
| 2005/0102597 A1* | 5/2005 | Martinez | H03M 13/2978 714/752 |
| 2012/0177152 A1* | 7/2012 | Kumar | H03M 13/2957 375/341 |
| 2016/0013814 A1 | 1/2016 | Cideciyan | |
| 2016/0164542 A1 | 6/2016 | Cideciyan | |

* cited by examiner

*Primary Examiner* — Guy Lamarre
(74) *Attorney, Agent, or Firm* — Zilka-Kotab, PC

(57) ABSTRACT

In one embodiment, a method includes loading first data into a first buffer of an interposer during a first time period and loading second data into a second buffer of the interposer and performing a first decoding operation on the first data using a first decoder during a second time period. The method includes loading third data into a third buffer of the interposer, performing the first decoding operation on the second data using the first decoder, and performing a second decoding operation on the first data using a second decoder during a third time period. Moreover, the method includes loading fourth data into a fourth buffer of the interposer, performing the first decoding operation on the third data using the first decoder, and performing the second decoding operation on the second data during a fourth time period. The first and second decoding operations are C1 or C2 decoding operations.

24 Claims, 18 Drawing Sheets

C2/C1 @ Full Bandwidth

| | | | | | | | | | | | | | | |
|---|---|---|---|---|---|---|---|---|---|---|---|---|---|---|
| Buffer 1: | L | C1 | C2 | U | L | C2 | C1 | U | L | C2 | C1 | U | | |
| Buffer 2: | | C2 | C1 | U | L | C1 | C2 | U | L | C1 | C2 | U | | |
| Buffer 3: | | L | C2 | C1 | U | L | C2 | C1 | U | L | C2 | C1 | U | |
| Buffer 4: | | | L | C2 | C1 | U | L | C2 | C1 | U | L | C2 | C1 | U |

C2/C1/C2/C1 @ Half Bandwidth

| | | | | | | | | | | | | | |
|---|---|---|---|---|---|---|---|---|---|---|---|---|---|
| Buffer 1: | L | C2 | - | - | - | C1 | C2 | L | U | C1 | C2 | - | - |
| Buffer 2: |   | C1 | C2 | - | - | C2 | L | U | C1 | C2 | - | - | C1 |
| Buffer 3: |   | L  | -  | C1 | C2 | L | U | C1 | C2 | - | - | C1 | C2 |
| Buffer 4: |   |    | C2 | L  | U  | U | C1 | C2 | - | - | C1 | C2 | L  |

C2/C1/C2 @ Full Bandwidth

| | | | | | | | | | | | | | | |
|---|---|---|---|---|---|---|---|---|---|---|---|---|---|---|
| Buffer 1: | L | C2 | C1 | C2' | U | L | C2 | C1 | C2' | U | | | | |
| Buffer 2: | | L | C2 | C1 | C2' | U | L | C2 | C1 | C2' | U | | | |
| Buffer 3: | | | L | C2 | C1 | C2' | U | L | C2 | C1 | C2' | U | | |
| Buffer 4: | | | | L | C2 | C1 | C2' | U | L | C2 | C1 | C2' | U | |
| Buffer 5: | | | | | L | C2 | C1 | C2' | U | L | C2 | C1 | C2' | U |

FIG. 10

C2/C1 @ Full Bandwidth

| | | | | | | | | | | | | | | |
|---|---|---|---|---|---|---|---|---|---|---|---|---|---|---|
| Buffer 1: | C2 | C1 | U | L | C2 | C1 | U | L | C2 | C1 | U | | | |
| Buffer 2: | L | C2 | C1 | U | L | C2 | C1 | U | L | C2 | C1 | U | | |
| Buffer 3: | | L | C2' | C1' | U | L | C2' | C1' | U | L | C2' | C1' | U | |
| Buffer 4: | | | L | C2' | C1' | U | L | C2' | C1' | U | L | C2' | C1' | U |

FIG. 12

C2/C1/C2 @ 4/5 Bandwidth

| | | | | | | | | | | | | |
|---|---|---|---|---|---|---|---|---|---|---|---|---|
| Buffer 1: | L | C1 | C2 | U | L | C2 | C1 | C2 | U | | | |
| Buffer 2: | C2 | C2 | C1 | C2 | U | L | C1 | C2 | U | | | |
| Buffer 3: | | L | C2' | C1' | C2' | U | L | C1' | C2' | U | | |
| Buffer 4: | | | L | C2' | C1' | C2' | L | U | C2' | C1' | C2' | U |

FIG. 13

C2/C1/C2/C1 @ 2/3 Bandwidth

| | | | | | | | | | | | | | |
|---|---|---|---|---|---|---|---|---|---|---|---|---|---|
| Buffer 1: | L | C2 | C1 | C2 | C1 | U | L | C2 | C1 | C2 | C1 | U | |
| Buffer 2: | | L | C2 | C1 | C2 | C1 | U | L | C2 | C1 | C2 | C1 | U |
| Buffer 3: | | | L | C2' | C1' | C2' | C1' | U | L | C2' | C1' | C2' | C1' | U |
| Buffer 4: | | | | L | C2' | C1' | C2' | C1' | U | L | C2' | C1' | C2' | C1' | U |

C2/C1/C2/C1/C2 @ 4/7 Bandwidth

| | | | | | | | | | | | |
|---|---|---|---|---|---|---|---|---|---|---|---|
| Buffer 1: | L | C1 | C2 | C1 | C2 | L | C1 | C2 | C1 | C2 | |
| Buffer 2: | C2 | C2 | C1 | L | U | C2 | C1 | C2 | C1 | C1 | U |
| Buffer 3: | | L | C2' | C1' | C2' | U | L | C2' | C1' | C2' | C1' | C2' |
| Buffer 4: | | | L | C2' | C1' | C2' | U | C1' | C2' | C1' | C2' | C1' |

PIPELINED ARCHITECTURE FOR ITERATIVE DECODING OF PRODUCT CODES

BACKGROUND

The present invention relates to data storage systems, and more specifically, to an architecture that incorporates pipeline characteristics for iterative decoding of product codes.

Currently-used linear tape drives apply two-dimensional product codes for error correction coding (ECC). These product codes generally contain two orthogonally-placed component codes consisting of a C1 row code and a C2 column code. C1 and C2 codes are in general linear block codes with minimum Hamming distance d1 and d2, respectively, which may be a binary (bit-based) code, such as a binary Bose-Chaudhuri-Hocquenghem (BCH) code over Galois Field (GF) of GF(2) or a symbol-based code with symbol alphabet size Q, such as a Reed-Solomon (RS) code over $GF(Q=2^q)$ with q-bit symbols, or a nonbinary BCH code over $GF(Q=2^q)$ with q-bit symbols, etc. In storage and transmission systems, typically Q=2 (1-bit symbol, i.e., binary codes), Q=16 (4-bit symbol), Q=64 (6-bit symbol), Q=256 (8-bit symbol), Q=512 (9-bit symbol), Q=1024 (10-bit symbol), or Q=4096 (12-bit symbol), etc.

Tape storage and optical storage technologies typically use C1 and C2 codes that are RS codes, while flash memory and optical communication technologies typically use C1 and C2 codes that are binary BCH codes.

Failure to decode a product codeword, which requires successful decoding of all C1 rows and all C2 columns within a product code, leads to a temporary and/or permanent error, and the decoder for the product code (possibly an iterative decoder) does not produce a valid product codeword. In order to reduce the number of errors, iterative decoding may be used where the product codeword is decoded by repeatedly decoding the C1 codewords and C2 codewords that comprise the product code.

However, this may cause a delay in the reading of data when using conventional tape drive architectures for the data to be decoded repeatedly. It is important that when performing error correction that the tape drive is able to continuously stream data from the tape at the highest possible tape velocity while the data is being decoded. Therefore, it would be beneficial to have an architecture configured for iterative decoding, while maintaining a high-throughput.

SUMMARY

In one embodiment, a system includes a plurality of discrete hardware buffers configured to store data during different stages of iterative decoding, the plurality of buffers having: a first buffer, a second buffer, a third buffer, and a fourth buffer. The system also includes a controller and logic integrated with and/or executable by the controller. The logic is configured to cause the controller to load first data into the first buffer during a first time period and load second data into the second buffer and perform a first decoding operation on the first data using a first decoder during a second time period. The logic is also configured to cause the controller to load third data into the third buffer, perform the first decoding operation on the second data using the first decoder, and perform a second decoding operation on the first data using a second decoder during a third time period. Moreover, the logic is configured to cause the controller to load fourth data into the fourth buffer, perform the first decoding operation on the third data using the first decoder, and perform the second decoding operation on the second data during a fourth time period. The first decoding operation and second decoding operation are uniquely selected from a group consisting of: a C1 decoding operation and a C2 decoding operation.

In another embodiment, a controller-implemented method includes loading first data into a first buffer of an interposer during a first time period and loading second data into a second buffer of the interposer and performing a first decoding operation on the first data using a first decoder during a second time period. The controller-implemented method also includes loading third data into a third buffer of the interposer, performing the first decoding operation on the second data using the first decoder, and performing a second decoding operation on the first data using a second decoder during a third time period. Moreover, the controller-implemented method includes loading fourth data into a fourth buffer of the interposer, performing the first decoding operation on the third data using the first decoder, and performing the second decoding operation on the second data during a fourth time period. The first decoding operation and second decoding operation are uniquely selected from a group consisting of: a C1 decoding operation and a C2 decoding operation.

In another embodiment, a computer program product includes a computer readable storage medium having program instructions embodied therewith. The embodied program instructions are executable by a controller to cause the controller to load, by the controller, first data into a first buffer of an interposer during a first time period and load, by the controller, second data into a second buffer of the interposer and perform a first decoding operation on the first data using a first decoder during a second time period. The embodied program instructions are also executable by the controller to load, by the controller, third data into a third buffer, perform the first decoding operation on the second data using the first decoder, and perform a second decoding operation on the first data using a second decoder during a third time period. Moreover, the embodied program instructions are executable by the controller to load, by the controller, fourth data into a fourth buffer, perform the first decoding operation on the third data using the first decoder, and perform the second decoding operation on the second data during a fourth time period. The first decoding operation and second decoding operation are uniquely selected from a group consisting of: a C1 decoding operation and a C2 decoding operation.

Other aspects and embodiments of the present invention will become apparent from the following detailed description, which, when taken in conjunction with the drawings, illustrate by way of example the principles of the invention.

BRIEF DESCRIPTION OF THE DRAWINGS

FIG. 7 shows a pipeline for use of the buffers in FIG. 6, according to one embodiment.

FIG. 8 shows a pipeline for use of the buffers in FIG. 6, according to another embodiment.

FIG. 10 shows a pipeline for use of the buffers in FIG. 9, according to one embodiment.

FIG. 12 shows a pipeline for use of the buffers in FIG. 11, according to one embodiment.

FIG. 13 shows a pipeline for use of the buffers in FIG. 11, according to another embodiment.

FIG. 14 shows a pipeline for use of the buffers in FIG. 11, according to yet another embodiment.

FIG. 15 shows a pipeline for use of the buffers in FIG. 11, in accordance with another embodiment.

DETAILED DESCRIPTION

Figure 1:
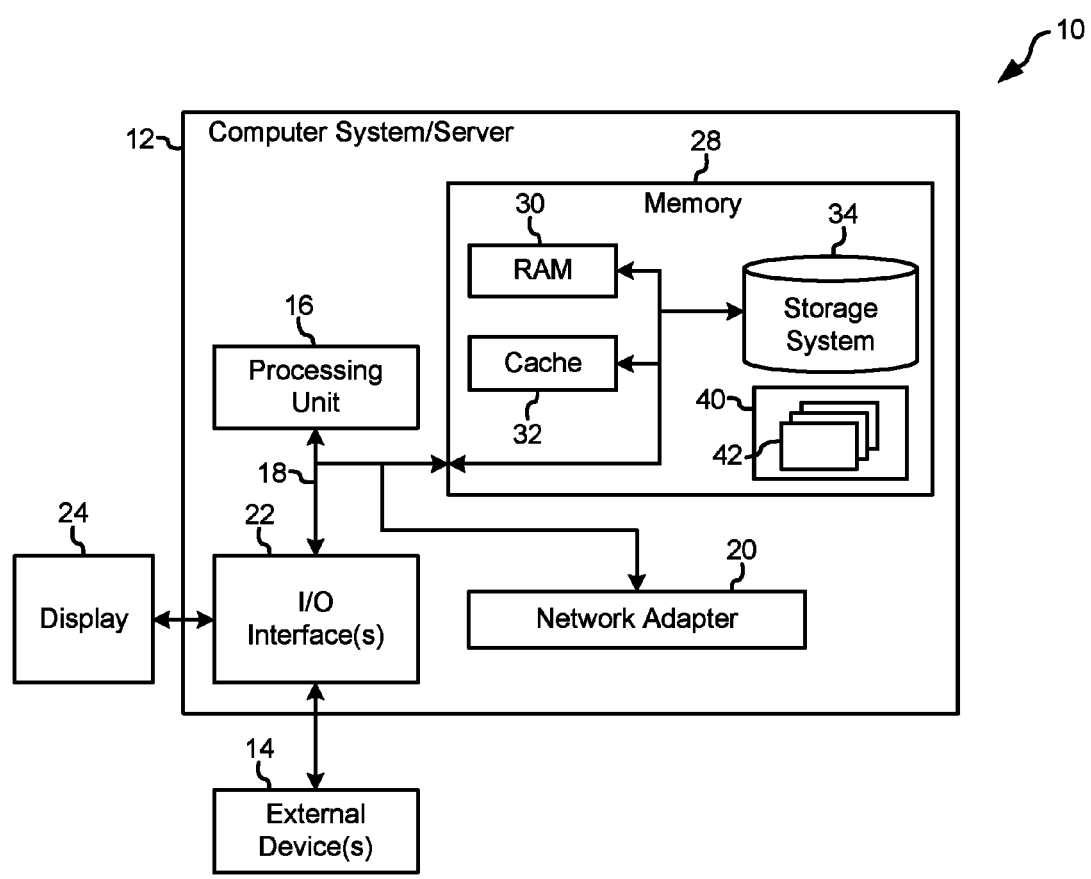
FIG. 1 illustrates a network storage system, according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The term "about" as used herein indicates the value preceded by the term "about," along with any values reasonably close to the value preceded by the term "about," as would be understood by one of skill in the art. When not indicated otherwise, the term "about" denotes the value preceded by the term "about"±10% of the value. For example, "about 10" indicates all values from and including 9.0 to 11.0.

The following description discloses several preferred embodiments of systems, methods, and computer program products for an iterative decoding architecture that utilizes a pipeline approach for buffer memories.

In one general embodiment, a system includes a plurality of discrete hardware buffers configured to store data during different stages of iterative decoding, the plurality of buffers having: a first buffer, a second buffer, a third buffer, and a fourth buffer. The system also includes a controller and logic integrated with and/or executable by the controller. The logic is configured to cause the controller to load first data into the first buffer during a first time period and load second data into the second buffer and perform a first decoding operation on the first data using a first decoder during a second time period. The logic is also configured to cause the controller to load third data into the third buffer, perform the first decoding operation on the second data using the first decoder, and perform a second decoding operation on the first data using a second decoder during a third time period. Moreover, the logic is configured to cause the controller to load fourth data into the fourth buffer, perform the first decoding operation on the third data using the first decoder, and perform the second decoding operation on the second data during a fourth time period. The first decoding operation and second decoding operation are uniquely selected from a group consisting of: a C1 decoding operation and a C2 decoding operation.

In another general embodiment, a controller-implemented method includes loading first data into a first buffer of an interposer during a first time period and loading second data into a second buffer of the interposer and performing a first decoding operation on the first data using a first decoder during a second time period. The controller-implemented method also includes loading third data into a third buffer of the interposer, performing the first decoding operation on the second data using the first decoder, and performing a second decoding operation on the first data using a second decoder during a third time period. Moreover, the controller-implemented method includes loading fourth data into a fourth buffer of the interposer, performing the first decoding operation on the third data using the first decoder, and performing the second decoding operation on the second data during a fourth time period. The first decoding operation and second decoding operation are uniquely selected from a group consisting of: a C1 decoding operation and a C2 decoding operation.

In another general embodiment, a computer program product includes a computer readable storage medium having program instructions embodied therewith. The embodied program instructions are executable by a controller to cause the controller to load, by the controller, first data into a first buffer of an interposer during a first time period and load, by the controller, second data into a second buffer of the interposer and perform a first decoding operation on the first data using a first decoder during a second time period. The embodied program instructions are also executable by the controller to load, by the controller, third data into a third buffer, perform the first decoding operation on the second data using the first decoder, and perform a second decoding operation on the first data using a second decoder during a third time period. Moreover, the embodied program instructions are executable by the controller to load, by the controller, fourth data into a fourth buffer, perform the first decoding operation on the third data using the first decoder, and perform the second decoding operation on the second data during a fourth time period. The first decoding operation and second decoding operation are uniquely selected from a group consisting of: a C1 decoding operation and a C2 decoding operation.

Referring now to FIG. 1, a schematic of a network storage system 10 is shown according to one embodiment. This network storage system 10 is only one example of a suitable storage system and is not intended to suggest any limitation as to the scope of use or functionality of embodiments of the invention described herein. Regardless, network storage system 10 is capable of being implemented and/or performing any of the functionality set forth hereinabove.

In the network storage system 10, there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in the network storage system 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 may include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 may be provided for reading from and writing to a non-removable, non-volatile magnetic media—not shown and typically called a "hard disk," which may be operated in a HDD. Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media may be provided. In such instances, each may be connected to bus 18 by one or more data media interfaces. As will be further depicted and described below, memory 28 may include at least one program product having a set (e.g., at least one) of program modules that are configured to carry out the functions of embodiments described herein.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication may occur via Input/Output (I/O) interfaces 22. Still yet, computer system/server 12 may communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, redundant array of independent disks (RAID) systems, tape drives, and data archival storage systems, etc.

Figure 2:
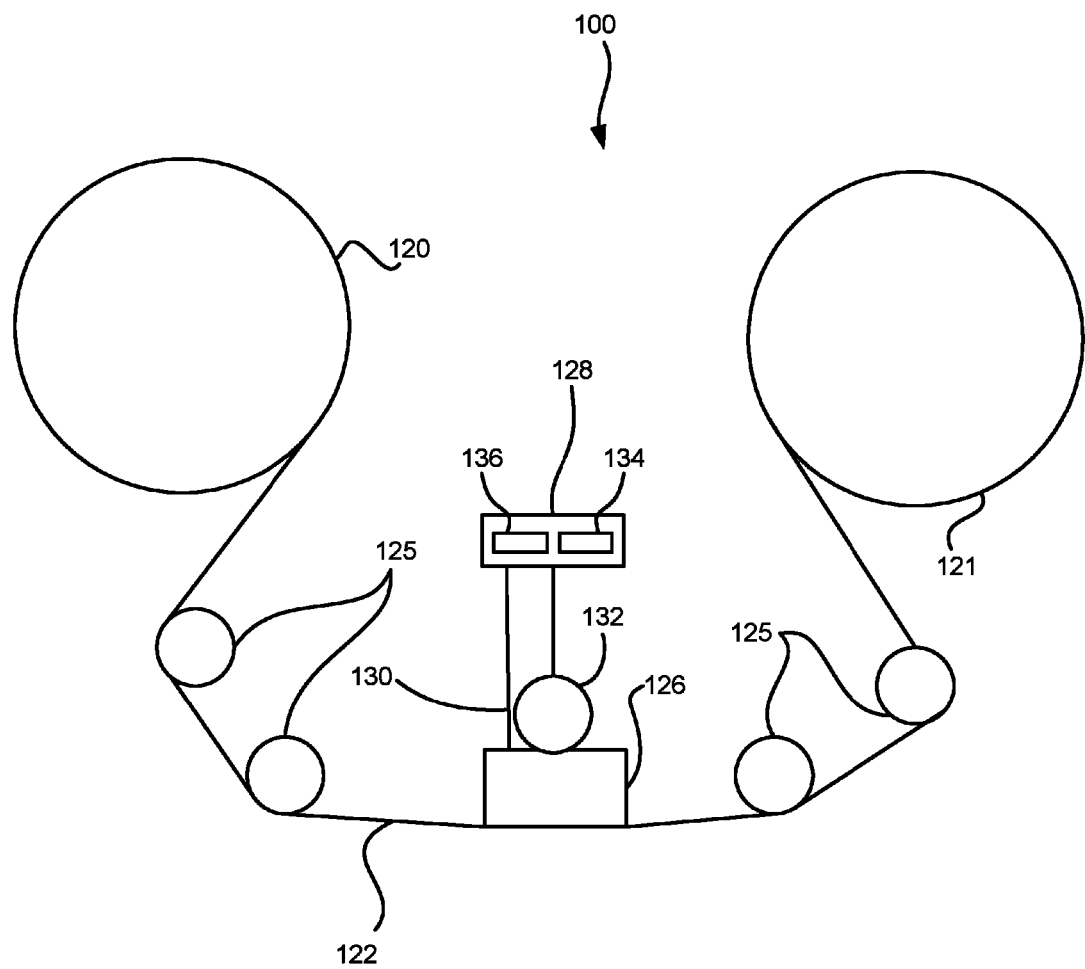
FIG. 2 illustrates a simplified tape drive of a tape-based data storage system, according to one embodiment.

FIG. 2 illustrates a simplified tape drive 100 of a tape-based data storage system, which may be employed in the context of the present invention. While one specific implementation of a tape drive is shown in FIG. 2, it should be noted that the embodiments described herein may be implemented in the context of any type of tape drive system.

As shown, a tape supply cartridge 120 and a take-up reel 121 are provided to support a tape 122. One or more of the reels may form part of a removable cartridge and are not necessarily part of the tape drive 100. The tape drive, such as that illustrated in FIG. 2, may further include drive motor(s) to drive the tape supply cartridge 120 and the take-up reel 121 to move the tape 122 over a tape head 126 of any type. Such head may include an array of readers, writers, or both.

Guides 125 guide the tape 122 across the tape head 126. Such tape head 126 is in turn coupled to a controller 128 via a cable 130. The controller 128, may be or include a processor and/or any logic for controlling any subsystem of the tape drive 100. For example, the controller 128 typically controls head functions such as servo following, data writing, data reading, etc. The controller 128 may include at least one servo channel and at least one data channel, each of which include data flow processing logic configured to process and/or store information to be written to and/or read from the tape 122. The controller 128 may operate under logic known in the art, as well as any logic disclosed herein, and thus may be considered as a processor for any of the descriptions of tape drives included herein, in various embodiments. The controller 128 may be coupled to a memory 136 of any known type, which may store instructions executable by the controller 128. Moreover, the controller 128 may be configured and/or programmable to perform or control some or all of the methodology presented herein. Thus, the controller 128 may be considered to be configured to perform various operations by way of logic programmed into one or more chips, modules, and/or blocks; software, firmware, and/or other instructions being available to one or more processors; etc., and combinations thereof.

The cable 130 may include read/write circuits to transmit data to the head 126 to be recorded on the tape 122 and to receive data read by the head 126 from the tape 122. An actuator 132 controls position of the head 126 relative to the tape 122.

An interface 134 may also be provided for communication between the tape drive 100 and a host (internal or external) to send and receive the data and for controlling the operation of the tape drive 100 and communicating the status of the tape drive 100 to the host, all as will be understood by those of skill in the art.

Figure 3:
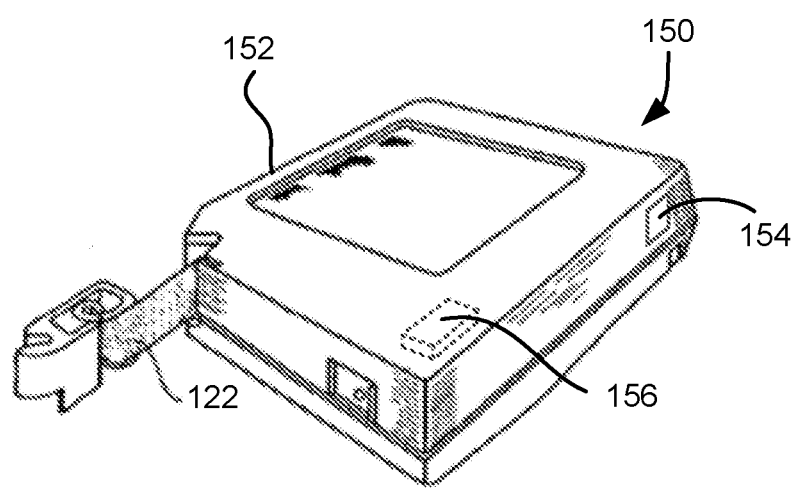
FIG. 3 is a schematic diagram of a tape cartridge according to one embodiment.

FIG. 3 illustrates an exemplary tape cartridge 150 according to one embodiment. Such tape cartridge 150 may be used with a system such as that shown in FIG. 2. As shown, the tape cartridge 150 includes a housing 152, a tape 122 in the housing 152, and a nonvolatile memory 156 coupled to the housing 152. In some approaches, the nonvolatile memory 156 may be embedded inside the housing 152, as shown in FIG. 3. In more approaches, the nonvolatile memory 156 may be attached to the inside or outside of the housing 152 without modification of the housing 152. For example, the nonvolatile memory may be embedded in a self-adhesive label 154. In one preferred embodiment, the nonvolatile memory 156 may be a Flash memory device, ROM device, etc., embedded into or coupled to the inside or outside of the tape cartridge 150. The nonvolatile memory is accessible by the tape drive and the tape operating software (the driver software), and/or other device.

Figure 4:
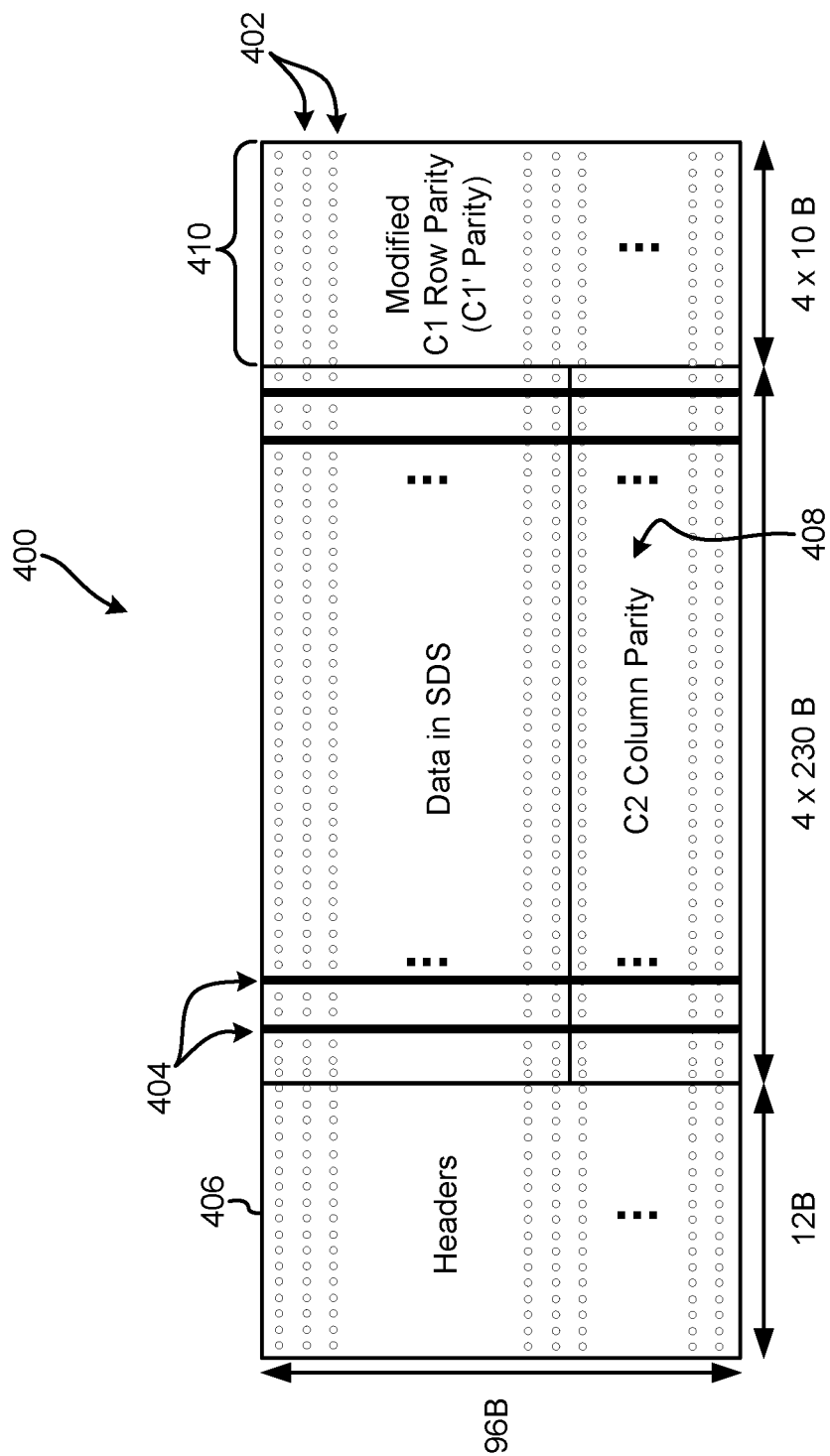
FIG. 4 shows a logical data array that may be used to organize data in a sub data set (SDS) using a product code, according to one embodiment.

FIG. 4 shows a logical data array 400 that may be used to organize data in a sub data set (SDS), according to one embodiment. As shown, the data array includes a plurality of rows 402 and columns 404. Each row 402 in the data array 400 is a codeword interleave (CWI) that includes a plurality of C1 codewords. When the CWI includes four interleaved codewords, it is referred to as a CWI-4. The data in the SDS is protected by C1 encoding across each row 402 to produce C1 row parity (not shown as it is modified later to produce the data array 400), and by C2 encoding across each column 404 to produce C2 column parity 408.

As shown, the headers 406 for each row 402 may be encoded using a C1 encoding scheme by modifying the C1 parity (computed for the data in the row 402 only) to account for the headers 406 to produce C1' parity 410. In this embodiment, the headers 406 are protected by one-level error correction coding (ECC) (C1' parity 410 only), whereas the data is protected by two-level ECC (C1' parity 410 and C2 parity 408).

Each data set includes multiple sub data sets and each sub data set may be represented by a logical two-dimensional array. Usually hundreds of headers are assigned to a single data set because each data set includes multiple SDSs and each row (CWI) of a column-encoded SDS is assigned a header. Currently-used linear tape drives simultaneously write and read up to 32 tracks to and/or from a magnetic tape medium. C1 row codewords of a product code are written in a byte-interleaved fashion onto a plurality of individual tracks of the magnetic tape medium, and are then read from these individual tracks simultaneously.

Figure 5:
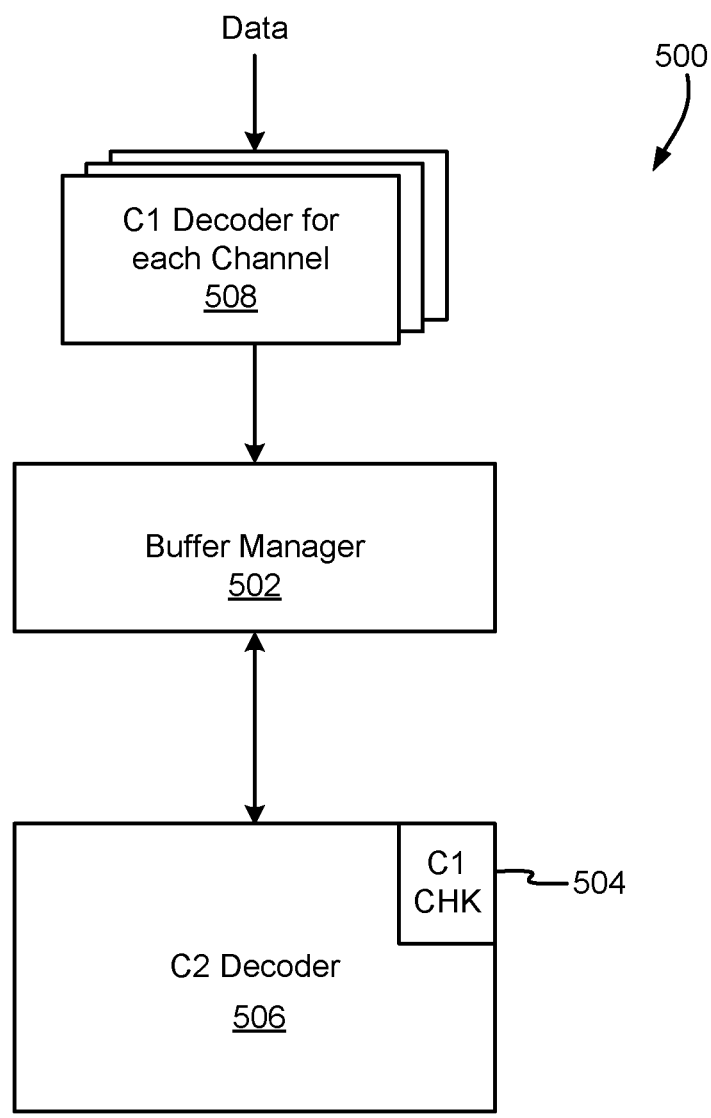
FIG. 5 shows a conventional architecture for non-iterative decoding according to the prior art.

Now referring to FIG. 5, a conventional architecture 500 for non-iterative decoding is shown according to the prior art. As shown, a buffer manager 502 is in electrical communication with a C2 decoder 506, which includes a C1 syndrome check module 504 configured to perform a C1 syndrome check on decoded data to determine whether decoding is successful or not. The buffer manager 502 is also in communication with one or more C1 decoders 508, from which it receives the data/codewords to be processed.

According embodiments described herein, iterative decoding includes any number of full or partial iterations of C1 and C2 decoding that number more than one full iteration (C1/C2 or C2/C1). In one embodiment, iterative decoding may include three decoding operations for 1½ full iterations: C1 decoding, followed by C2 decoding, and then C1 decoding again (C1/C2/C1) using two decoders: a C1 decoder and a C2 decoder. In an alternate embodiment, iterative decoding may include C2/C1/C2. In more embodiments, iterative decoding may include C1/C2/C1/C2, C1/C2/C1/C2/C1, C2/C1/C2/C1, and C2/C1/C2/C1/C2, etc.

These full or partial iterations of C1/C2 or C2/C1 decoding may be preceded and/or followed by one or more additional decoding operations, such as additional C1 decoding, C2 decoding, modulation decoding, etc. For example, the one or more C1 decoders 508 that the buffer manager 502 is in communication with may provide additional C1 decoding operations to any data received by the buffer manager 502 prior to operations directed by the buffer manager 502. For the sake of the following descriptions, any previous and/or subsequent decoding operations are not described when considering whether full or partial C1/C2 or C2/C1 decoding is being performed in each of the following embodiments.

In more alternate embodiments, more than two decoders may be used to perform the C1 and C2 decoding. For example, an additional C1 decoder, denoted as a C1' decoder, and/or an additional C2 decoder, denoted as a C2' decoder, may be used alone or in combination with either or both of the C1 decoder and the C2 decoder. In this way, the same iterative decoding embodiments described above may be performed on the data, but more decoding operations may be performed at any given time due to the additional decoders available.

In each of these embodiments, more decoding steps may be performed after the last C1 or C2 decoding operation, alternating between C1 and C2 decoding, until decoding is complete, a predetermined maximum number of iterations is reached, or a permanent error is output.

In one exemplary embodiment, iterative decoding may utilize a C1 code that is a Reed-Solomon RS(240,228) code with a codeword length (N1) equal to 240 and a minimum Hamming distance (d1) equal to 13 (i.e., N1=240, d1=13), and a C2 code that is a RS(192,168) code with a codeword length (N2) equal to 192 and a minimum Hamming distance (d2) equal to 25 (i.e., N2=192, d2=25). Of course, many different C1 and C2 codes are possible, as would be understood by one of skill in the art.

The ECC decoder may be configured to perform iterative decoding followed by a first syndrome check (of whichever of C1 or C2 was not last decoded) and a second syndrome check (of the other C1 or C2 code) while operating in streaming mode. The decoding of data (which includes a received product codeword) is deemed successful after decoding if and only if all C1 codewords in an individual product codeword are permitted (i.e., all C1 codewords have zero syndrome which is equivalent to all C1 codewords passing the C1 syndrome check) and all C2 codewords in the same individual product codeword are permitted (i.e., all C2 codewords have zero syndrome which is equivalent to all C2 codewords passing the C2 syndrome check). Otherwise, the decoding is deemed to be unsuccessful.

Figure 6:
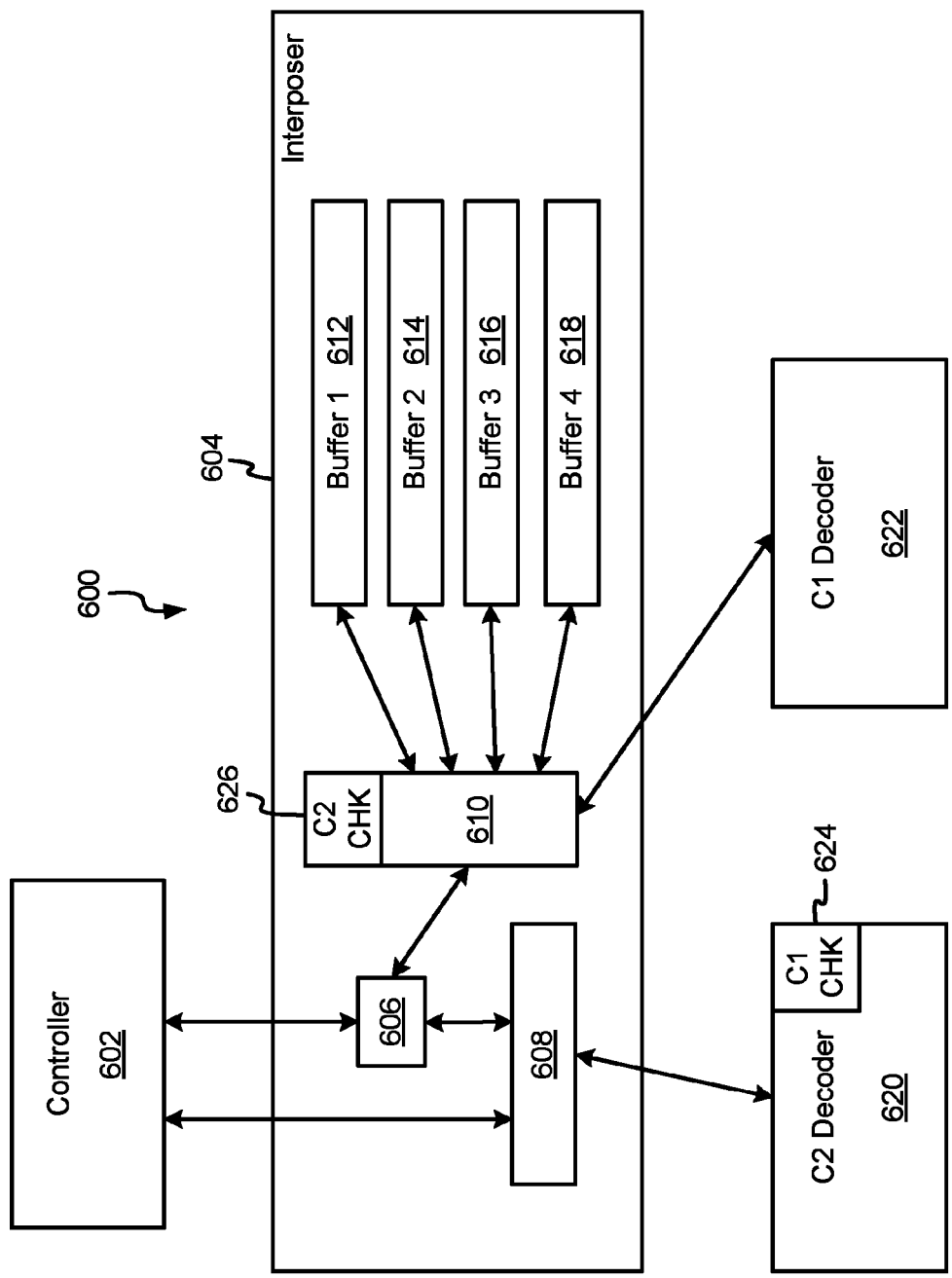
FIG. 6 shows an architecture for iterative decoding, according to one embodiment.

With reference to FIG. 6, one embodiment of an architecture 600 for iterative decoding is shown according to one embodiment. In this architecture 600, a controller 602 is in electrical communication with an interposer 604. The controller 602 may further be in communication with a C1 decoder in each channel (not shown), from which it receives the data/codewords to be processed, which may have C1 decoding already performed thereon, in one approach.

The interposer 604 comprises a multiplexer 606 in electrical communication with the controller 602 and a buffer memory interface 610, which is configured to store and retrieve data using a plurality of discrete hardware buffers (in architecture 600, four buffers are included: Buffer 1 612, Buffer 2 614, Buffer 3 616, and Buffer 4 618). The interposer 604 also includes a second multiplexer 608 that is in electrical communication with the controller 602, a C2 decoder 620, and the first multiplexer 606.

The electrical connection between the controller 602 and the second multiplexer 608 may be the legacy connection that is used in conventional tape drives to connect the buffer manager to the C2 decoder, according to one embodiment, and as described in FIG. 5.

Referring again to FIG. 6, each of the plurality of discrete buffer memories (e.g., Buffer 1 612, Buffer 2 614, Buffer 3 616, and Buffer 4 618, etc.) may comprise any memory suitable for use as a buffer, such as RAM, dynamic RAM (DRAM), embedded DRAM (eDRAM), static RAM (SRAM), erasable programmable read-only memory (EPROM), electric EPROM (EEPROM), non-volatile RAM (NVRAM), Flash memory, etc., in various approaches.

Moreover, each of the plurality of discrete buffer memories (e.g., Buffer 1 612, Buffer 2 614, Buffer 3 616, and Buffer 4 618, etc.) may be configured to have sufficient storage space to store a predetermined amount of data, such as a SDS, or some other amount of data that is beneficial to the design considerations of the interposer 604.

The buffer memory interface 610 is configured to store data to each of the plurality of discrete buffer memories (e.g., Buffer 1 612, Buffer 2 614, Buffer 3 616, and Buffer 4 618, etc.) individually, and to retrieve data from each of the plurality of discrete buffer memories (e.g., Buffer 1 612, Buffer 2 614, Buffer 3 616, and Buffer 4 618, etc.) individually.

The interposer 604 also comprises a C2 syndrome check module 626 configured to perform a C2 syndrome check on data received from the C1 decoder 622 after having C1 decoding performed thereon, in one embodiment.

The C2 decoder 620 comprises a C1 syndrome check module 624 configured to perform a C1 syndrome check on data that has been C2 decoded by the C2 decoder 620, in one embodiment.

The use of the plurality of discrete buffer memories (e.g., Buffer 1 612, Buffer 2 614, Buffer 3 616, and Buffer 4 618, etc.) during iterative decoding is described in FIGS. 7-8 according to various embodiments.

As FIG. 7 shows, four buffers, Buffer 1, Buffer 2, Buffer 3, and Buffer 4, may be utilized during a plurality of sequential or consecutive time periods (denoted by the columns in the table) in order to perform iterative decoding comprising at least one full iteration. Each time period may include a sufficient amount of time to perform a decoding operation (C1 or C2), whichever takes longer, on data stored in each buffer, with the assumption that decoding operations take longer than loading and unloading operations. Moreover, in one embodiment, each time period is approximately identical in duration. For example, each time period may have a duration in a range from about 10 microseconds to about 1000 microseconds, e.g., about 50 microseconds, 100 microseconds, etc.

For the remainder of the descriptions of FIG. 7, a first decoding operation refers to C2 decoding, a second decoding operation refers to C1 decoding, a first decoder refers to a C2 decoder, and a second decoder refers to a C1 decoder.

However, in an alternate embodiment not described in detail here, a first decoding operation may refer to C1 decoding, a second decoding operation may refer to C2 decoding, a first decoder may refer to a C1 decoder, and a second decoder may refer to a C2 decoder.

In other words, the first decoding operation and second decoding operation are uniquely selected from a group consisting of: a C1 decoding operation and a C2 decoding operation, such that when the first decoding operation is a C2 decoding operation, the second decoding operation is a C1 decoding operation. Conversely, when the first decoding operation is a C1 decoding operation, the second decoding operation is a C2 decoding operation.

As shown, first data (such as a first SDS, codeword, or some other portion of encoded data) is loaded into the first buffer during a first time period. When the interposer is being initialized, no other buffers will have any data stored therein, and no other operations will take place during the initialization phase in the first time period.

In the second time period, second data is loaded into the second buffer and a first decoding operation is performed on the first data using a first decoder.

Thereafter, during the third time period, third data is loaded into the third buffer, the first decoding operation is performed on the second data using the first decoder, and a second decoding operation is performed on the first data using a second decoder.

In the fourth time period, fourth data is loaded into the fourth buffer, the first decoding operation is performed on the third data using the first decoder, the second decoding operation is performed on the second data using the second decoder, and the first data is unloaded from the first buffer.

As shown in time periods five through eight, after the initialization of the four buffers, operations will take place on all four buffers in each time period. This embodiment allows for continuous streaming of data from a storage medium at full bandwidth while performing at most a full iteration (C2/C1) of decoding on the read data from the controller. Should additional iterations be desired and/or required due to unsuccessful decoding, the storage medium is stopped to prevent further reading of data, and N more iterations of C2/C1 decoding are performed on the previously read data, with N being a positive integer of not less than 1, such as 2, 3, 4, etc.

Full bandwidth is a term used to describe the highest rate at which data may be processed, and is determined based on medium speed, number of parallel channels, number of tracks in the medium, processing speed, etc. In one embodiment, full bandwidth may be in a range from about 300 MB/s to about 800 MB/s, e.g., about 500 MB/s. In other embodiments, full bandwidth may be higher than 800 MB/s.

According to another embodiment, as shown in FIG. 8, four buffers, Buffer 1, Buffer 2, Buffer 3, and Buffer 4, may be utilized to perform at most two full iterations of iterative decoding (C2/C1/C2/C1 or C1/C2/C1/C2) at half bandwidth, or one full iteration of decoding at full bandwidth.

Half bandwidth, and any other term referring to a portion of bandwidth, are terms used to describe lower rates at which data may be processed in comparison to full bandwidth. These rates are determined based on the decoding scheme and the full bandwidth capability as described previously. In one embodiment, half bandwidth may be in a range from about 150 MB/s to about 400 MB/s, e.g., about 250 MB/s. In other embodiments, half bandwidth may be higher than 400 MB/s.

For the remainder of the descriptions of FIG. 8, a first decoding operation refers to C2 decoding, a second decoding operation refers to C1 decoding, a first decoder refers to a C2 decoder, and a second decoder refers to a C1 decoder.

However, in an alternate embodiment not described in detail here, a first decoding operation may refer to C1 decoding, a second decoding operation may refer to C2 decoding, a first decoder may refer to a C1 decoder, and a second decoder may refer to a C2 decoder. In other words, the first decoding operation and second decoding operation are uniquely selected from a group consisting of: a C1 decoding operation and a C2 decoding operation, such that when the first decoding operation is a C2 decoding operation, the second decoding operation is a C1 decoding operation. Conversely, when the first decoding operation is a C1 decoding operation, the second decoding operation is a C2 decoding operation.

As shown, first data is loaded into the first buffer during a first time period. When the interposer is being initialized, no other buffers will have any data stored therein, and no other operations will take place during the initialization phase in the first time period.

In the second time period, second data is loaded into the second buffer and a first decoding operation is performed on the first data using a first decoder.

Then, during the third time period, third data is loaded into the third buffer, the first decoding operation is performed on the second data using the first decoder, and a second decoding operation is performed on the first data using a second decoder.

In the fourth time period, no action is performed on the data in the first buffer, fourth data is loaded into the fourth buffer, the first decoding operation is performed on the third data using the first decoder, and the second decoding operation is performed on the second data using the second decoder.

In the fifth time period, no action is performed on the data in the first and second buffers, the second decoding operation is performed on the third data using the second decoder, and the first decoding operation is performed on the fourth data using the first decoder.

In the sixth time period, no action is performed on the data in the second and third buffers, the first decoding operation is performed on the first data using the first decoder, and the second decoding operation is performed on the fourth data using the second decoder.

In the seventh time period, no action is performed on the data in the third and fourth buffers, the second decoding operation is performed on the first data using the second decoder, and the first decoding operation is performed on the second data using the first decoder.

In the eighth time period, no action is performed on the data in the fourth buffer, the first data is unloaded from the first buffer, the second decoding operation is performed on the second data using the second decoder, and the first decoding operation is performed on the third data using the first decoder.

Then, the time periods continue cycling in an anticipated manner as shown after the initialization of the buffers in the first eight time periods.

As shown in time periods eight and beyond, after the initialization of the four buffers, operations may take place on all four buffers in each time period except during the two time period shifted delay. This embodiment allows for continuous streaming of data from the storage medium at half bandwidth while performing at most two full iterations (C2/C1/C2/C1) of decoding on the read data from the controller.

Should additional iterations be desired and/or required due to unsuccessful decoding, the storage medium is stopped to prevent further reading of data, and N more double iterations of C2/C1 decoding are performed on the previously read data, with N being a positive integer of not less than 1, such as 2, 3, 4, etc.

Moreover, the only additional component added to the architecture of FIG. 6 in order to accomplish this embodiment of iterative decoding is a second state machine in the interposer 604 to keep track of the iterations of C2/C1 decoding.

Figure 9:
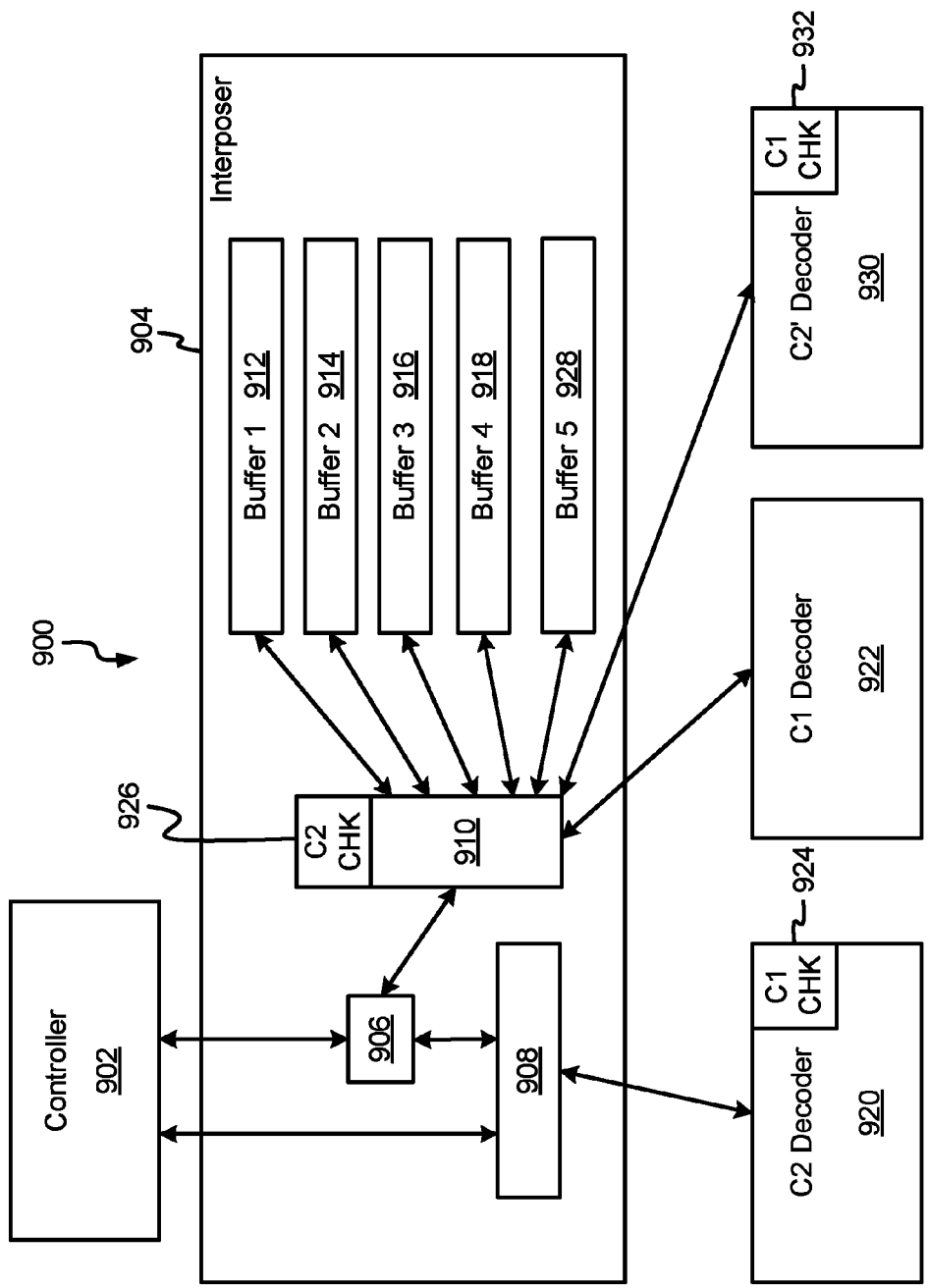
FIG. 9 shows an architecture for iterative decoding, according to one embodiment.

Now referring to FIG. 9, another embodiment of an architecture 900 for iterative decoding is shown according to one embodiment. In this architecture 900, a controller 902 is in electrical communication with an interposer 904. The interposer 904 comprises a multiplexer 906 in electrical communication with the controller 902 and a buffer memory interface 910, which is configured to store and retrieve data using a plurality of discrete hardware buffers (in architecture 900, five buffers are included: Buffer 1 912, Buffer 2 914, Buffer 3 916, Buffer 4 918, and Buffer 5 928). The interposer 904 also includes a second multiplexer 908 that is in electrical communication with the controller 902, a C2 decoder 920, and the first multiplexer 906.

The electrical connection between the controller 902 and the second multiplexer 908 may be the legacy connection that is used in conventional tape drives to connect the buffer manager to the C2 decoder, according to one embodiment, and as described in FIG. 5.

Referring again to FIG. 9, the interposer 904 also comprises a C2 syndrome check module 926 configured to perform a C2 syndrome check on data received from the C1 decoder 922 after having C1 decoding performed thereon, in one embodiment.

The C2 decoder 920 comprises a C1 syndrome check module 924 configured to perform a C1 syndrome check on data that has been C2 decoded by the C2 decoder 920, in one embodiment. Moreover, the second C2 decoder (referred to as the C2' decoder 930) comprises a C1 syndrome check module 932 configured to perform a C1 syndrome check on data that has been C2 decoded by the C2' decoder 930, in one embodiment.

The use of the plurality of discrete buffer memories (e.g., Buffer 1 912, Buffer 2 914, Buffer 3 916, Buffer 4 918, and Buffer 5 928, etc.) during iterative decoding is described in FIG. 10 according to one embodiment.

As FIG. 10 shows, five buffers, Buffer 1, Buffer 2, Buffer 3, Buffer 4, and Buffer 5 may be utilized during a plurality of sequential or consecutive time periods (denoted by the columns in the table) in order to perform iterative decoding comprising at least one and a half iterations. Each time period may include a sufficient amount of time to perform a decoding operation (C1 or C2), whichever takes longer, on data stored in each buffer, with the assumption that decoding operations take longer than loading and unloading operations.

For the remainder of the descriptions of FIG. 10, a first decoding operation refers to C2 decoding, a second decoding operation refers to C1 decoding, a first decoder refers to a C2 decoder, a second decoder refers to a C1 decoder, a third decoder refers to a second C2 decoder (denoted as C2').

However, in an alternate embodiment not described in detail here, a first decoding operation may refer to C1 decoding, a second decoding operation may refer to C2 decoding, a first decoder may refer to a C1 decoder, a second decoder may refer to a C2 decoder, a third decoder may refer to a second C1 decoder (denoted as C1').

In other words, the first decoding operation and second decoding operation are uniquely selected from a group consisting of: a C1 decoding operation and a C2 decoding operation, such that when the first decoding operation is a C2 decoding operation, the second decoding operation is a C1 decoding operation. Conversely, when the first decoding operation is a C1 decoding operation, the second decoding operation is a C2 decoding operation.

As shown, first data (such as a first SDS, codeword, or some other portion of encoded data) is loaded into the first buffer during a first time period. When the interposer is being initialized, no other buffers will have any data stored therein, and no other operations will take place during the initialization phase in the first time period.

In the second time period, second data is loaded into the second buffer and a first decoding operation is performed on the first data using a first decoder.

Thereafter, during the third time period, third data is loaded into the third buffer, the first decoding operation is performed on the second data using the first decoder, and a second decoding operation is performed on the first data using a second decoder.

In the fourth time period, fourth data is loaded into the fourth buffer, the first decoding operation is performed on the third data using the first decoder, the second decoding operation is performed on the second data using the second decoder, and the first decoding operation is performed on the first data using the third decoder (denoted as C2').

In the fifth time period, the first data is unloaded from the first buffer, the first decoding operation is performed on the second data using the third decoder (denoted as C2'), the second decoding operation is performed on the third data using the second decoder, the first decoding operation is performed on the fourth data using the first decoder, and fifth data is loaded into the fifth buffer.

As shown in time periods six through fourteen, after the initialization of the five buffers, operations will take place on all five buffers in each time period. This embodiment allows for continuous streaming of data from a storage medium at full bandwidth while performing at most 1½ full iterations (C2/C1/C2) of decoding on the read data from the controller. Should additional iterations be desired and/or required due to unsuccessful decoding, the storage medium is stopped, and N more iterations of C2/C1/C2 decoding, or any portion thereof, may be performed, such as N iterations of C1/C2 decoding, N iterations of C1 decoding, etc., with N being a positive integer of not less than 1, such as 2, 3, 4, etc.

Moreover, the only additional components added to the architecture of FIG. 6 in order to accomplish this embodiment of iterative decoding, as shown in FIG. 9 are one buffer memory 928 and a C2' decoder 930 having an onboard C1 syndrome check module 932. In addition, the state machine (not shown) that enforces pipeline operations is modified to account for the changes to the architecture.

Figure 11:
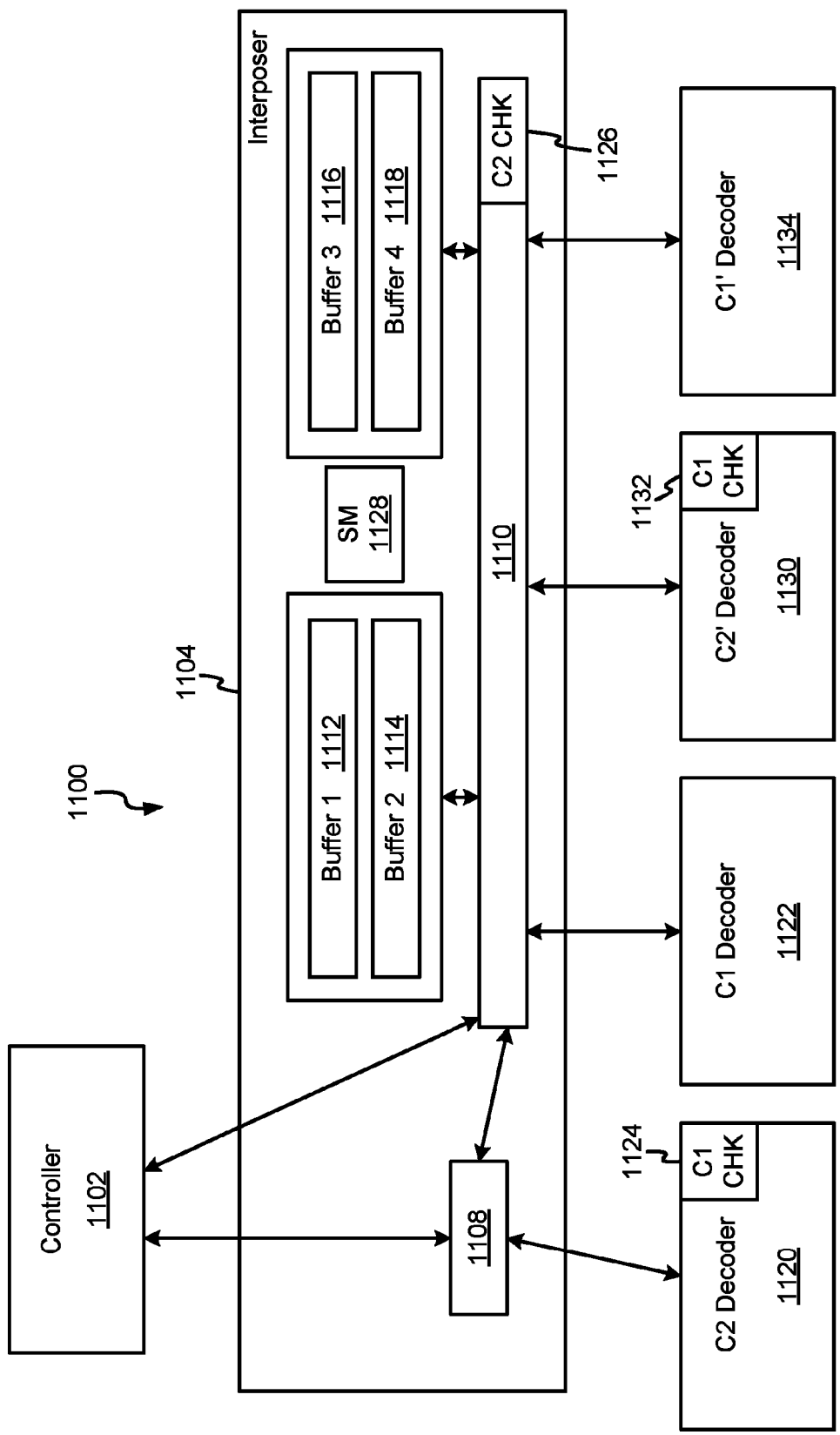
FIG. 11 shows an architecture for iterative decoding, according to one embodiment.

Now referring to FIG. 11, another embodiment of an architecture 1100 for iterative decoding is shown according to one embodiment. In this architecture 1100, a controller 1102 is in electrical communication with an interposer 1104. The interposer 1104 comprises a multiplexer 1108 in electrical communication with the controller 1102 and a buffer memory interface 1110, which is configured to store and retrieve data using a plurality of discrete hardware buffers (in architecture 1100, four buffers are included: Buffer 1 1112, Buffer 2 1114, Buffer 3 1116, and Buffer 4 1118).

The electrical connection between the controller 1102 and the multiplexer 1108 may be the legacy connection that is used in conventional tape drives to connect the buffer manager to the C2 decoder, according to one embodiment, and as described in FIG. 5.

Referring again to FIG. 11, the interposer 1104 also comprises a C2 syndrome check module 1126 configured to perform a C2 syndrome check on data received from the C1 decoder 1122 after having C1 decoding performed thereon in electrical communication with the first set of buffers 1112 and 1114, in one embodiment. Moreover, a second C1 decoder (referred to as the C1' decoder 1134) is in electrical communication with the interposer 1104 and the second set of buffers 1116 and 1118, in one embodiment.

The C2 decoder 1120 comprises a C1 syndrome check module 1124 configured to perform a C1 syndrome check on data that has been C2 decoded by the C2 decoder 1120, in one embodiment. Moreover, the second C2 decoder (referred to as the C2' decoder 1130) comprises a C1 syndrome check module 1132 configured to perform a C1 syndrome check on data that has been C2 decoded by the C2' decoder 1130 and is in electrical communication with the interposer 1104 and the second set of buffers 1116 and 1118, in one embodiment.

A second state machine 1128 is configured to control which data is stored in which buffer, and which decoding operation is to be performed on the data in each buffer, in one embodiment.

The use of the plurality of discrete buffer memories (e.g., Buffer 1 1112, Buffer 2 1114, Buffer 3 1116, and Buffer 4 1118, etc.) during iterative decoding is described in FIGS. 12-15 according to various embodiments.

As FIG. 12 shows, four buffers, Buffer 1, Buffer 2, Buffer 3, and Buffer 4 may be utilized during a plurality of sequential or consecutive time periods (denoted by the columns in the table) in order to perform iterative decoding comprising at least one full iteration (C2/C1) at full bandwidth. Each time period may include a sufficient amount of time to perform a decoding operation (C1 or C2), whichever takes longer, on data stored in each buffer, with the assumption that decoding operations take longer than loading and unloading operations.

For the remainder of the descriptions of FIG. 12, a first decoding operation refers to C2 decoding, a second decoding operation refers to C1 decoding, a first decoder refers to a C2 decoder, a second decoder refers to a C1 decoder, a third decoder refers to a second C2 decoder (denoted as C2'), and a fourth decoder refers to a second C1 decoder (denoted as C1'). However, in an alternate embodiment not described in detail here, a first decoding operation may refer to C1 decoding, a second decoding operation may refer to C2 decoding, a first decoder may refer to a C1 decoder, a second decoder may refer to a C2 decoder, a third decoder may refer to a second C1 decoder (denoted as C1'), and a fourth decoder may refer to a second C2 decoder (denoted as C2').

In other words, the first decoding operation and second decoding operation are uniquely selected from a group consisting of: a C1 decoding operation and a C2 decoding operation, such that when the first decoding operation is a C2 decoding operation, the second decoding operation is a C1 decoding operation. Conversely, when the first decoding operation is a C1 decoding operation, the second decoding operation is a C2 decoding operation.

As shown, first data (such as a first SDS, codeword, or some other portion of encoded data) is loaded into the first buffer during a first time period. When the interposer is being initialized, no other buffers will have any data stored therein, and no other operations will take place during the initialization phase in the first time period.

In the second time period, second data is loaded into the second buffer and a first decoding operation is performed on the first data using a first decoder.

Thereafter, during the third time period, third data is loaded into the third buffer, the first decoding operation is performed on the second data using the first decoder, and a second decoding operation is performed on the first data using a second decoder.

In the fourth time period, the first data is unloaded from the first buffer, fourth data is loaded into the fourth buffer, the first decoding operation is performed on the third data using a third decoder, and the second decoding operation is performed on the second data using the second decoder.

In the fifth time period, fifth data is loaded into the first buffer, the second data is unloaded from the second buffer, the first decoding operation is performed on the fourth data using the third decoder, and the second decoding operation is performed on the third data using a fourth decoder.

As shown in time periods five through eight, after the initialization of the four buffers, operations will take place on all four buffers in each time period. This embodiment allows for continuous streaming of data from a storage medium at full bandwidth while performing at most 1 full iteration (C2/C1) of decoding on the read data from the controller. Should additional iterations be desired and/or required due to unsuccessful decoding, the storage medium is stopped, and N more iterations of C2/C1 decoding, or any portion thereof, may be performed, such as N iterations of C2 decoding, N iterations of C1 decoding, etc., with N being a positive integer of not less than 1, such as 2, 3, 4, etc.

Moreover, additional components added to the architecture of FIG. 6 in order to accomplish this embodiment of iterative decoding, as shown in FIG. 11 are a C1' decoder 1134 and a C2' decoder 1130 having an onboard C1 syndrome check module 1132, and a second state machine 1128.

Now referring to FIG. 13, four buffers, Buffer 1, Buffer 2, Buffer 3, and Buffer 4 may be utilized during a plurality of sequential or consecutive time periods (denoted by the columns in the table) in order to perform iterative decoding comprising at least 1½ full iterations (C2/C1/C2) at ⅘ bandwidth. Each time period may include a sufficient amount of time to perform a decoding operation (C1 or C2), whichever takes longer, on data stored in each buffer, with the assumption that decoding operations take longer than loading and unloading operations.

For the remainder of the descriptions of FIG. 13, a first decoding operation refers to C2 decoding, a second decoding operation refers to C1 decoding, a first decoder refers to a C2 decoder, a second decoder refers to a C1 decoder, a third decoder refers to a second C2 decoder (denoted as C2'), and a fourth decoder refers to a second C1 decoder (denoted as C1'). However, in an alternate embodiment not described in detail here, a first decoding operation may refer to C1 decoding, a second decoding operation may refer to C2 decoding, a first decoder may refer to a C1 decoder, a second decoder may refer to a C2 decoder, a third decoder may refer to a second C1 decoder (denoted as C1'), and a fourth decoder may refer to a second C2 decoder (denoted as C2').

In other words, the first decoding operation and second decoding operation are uniquely selected from a group consisting of: a C1 decoding operation and a C2 decoding operation, such that when the first decoding operation is a C2 decoding operation, the second decoding operation is a C1 decoding operation. Conversely, when the first decoding operation is a C1 decoding operation, the second decoding operation is a C2 decoding operation.

As shown, first data (such as a first SDS, codeword, or some other portion of encoded data) is loaded into the first buffer during a first time period. When the interposer is being initialized, no other buffers will have any data stored therein, and no other operations will take place during the initialization phase in the first time period.

In the second time period, second data is loaded into the second buffer and a first decoding operation is performed on the first data using a first decoder.

Thereafter, during the third time period, third data is loaded into the third buffer, the first decoding operation is performed on the second data using the first decoder, and a second decoding operation is performed on the first data using a second decoder.

In the fourth time period, the first decoding operation is performed on the first data using the first decoder, the second decoding operation is performed on the second data using the second decoder, the first decoding operation is performed on the third data using a third decoder, and fourth data is loaded into the fourth buffer.

In the fifth time period, the first data is unloaded from the first buffer, the first decoding operation is performed on the second data using the first decoder, the second decoding operation is performed on the third data using a fourth decoder, and the first decoding operation is performed on the fourth data using the third decoder.

In the sixth time period, fifth data is loaded in the first buffer, the second data is unloaded from the second buffer, the first decoding operation is performed on the third data using the third decoder, and the second decoding operation is performed on the fourth data using the fourth decoder.

As shown in time periods six through ten, after the initialization of the four buffers, operations will take place on all four buffers in each time period. This embodiment allows for continuous streaming of data from a storage medium at ⅘ bandwidth while performing at most 1½ full iterations (C2/C1/C2) of decoding on the read data from the controller. Should additional iterations be desired and/or required due to unsuccessful decoding, the storage medium continues to be read at slower speed, and N more iterations of C2/C1/C2 decoding, or any portion thereof, may be performed, such as N more iterations of C2/C1 decoding, N more iterations of C1/C2 decoding, N more iterations of C1 decoding, etc., with N being a positive integer of not less than 1, such as 2, 3, 4, etc.

Now referring to FIG. 14, four buffers, Buffer 1, Buffer 2, Buffer 3, and Buffer 4 may be utilized during a plurality of sequential or consecutive time periods (denoted by the columns in the table) in order to perform iterative decoding comprising at least 2 full iterations (C2/C1/C2/C1) at ⅔ bandwidth. Each time period may include a sufficient amount of time to perform a decoding operation (C1 or C2), whichever takes longer, on data stored in each buffer, with the assumption that decoding operations take longer than loading and unloading operations.

For the remainder of the descriptions of FIG. 14, a first decoding operation refers to C2 decoding, a second decoding operation refers to C1 decoding, a first decoder refers to a C2 decoder, a second decoder refers to a C1 decoder, a third decoder refers to a second C2 decoder (denoted as C2'), and a fourth decoder refers to a second C1 decoder (denoted as C1'). However, in an alternate embodiment not described in detail here, a first decoding operation may refer to C1 decoding, a second decoding operation may refer to C2 decoding, a first decoder may refer to a C1 decoder, a second decoder may refer to a C2 decoder, a third decoder may refer to a second C1 decoder (denoted as C1'), and a fourth decoder may refer to a second C2 decoder (denoted as C2').

In other words, the first decoding operation and second decoding operation are uniquely selected from a group consisting of: a C1 decoding operation and a C2 decoding operation, such that when the first decoding operation is a C2 decoding operation, the second decoding operation is a C1 decoding operation. Conversely, when the first decoding operation is a C1 decoding operation, the second decoding operation is a C2 decoding operation.

As shown, first data (such as a first SDS, codeword, or some other portion of encoded data) is loaded into the first buffer during a first time period. When the interposer is being initialized, no other buffers will have any data stored therein, and no other operations will take place during the initialization phase in the first time period.

In the second time period, second data is loaded into the second buffer and a first decoding operation is performed on the first data using a first decoder.

Thereafter, during the third time period, third data is loaded into the third buffer, the first decoding operation is performed on the second data using the first decoder, and a second decoding operation is performed on the first data using a second decoder.

In the fourth time period, the first decoding operation is performed on the first data using the first decoder, the second decoding operation is performed on the second data using the second decoder, the first decoding operation is performed on the third data using a third decoder, and fourth data is loaded into the fourth buffer.

In the fifth time period, the second decoding operation is performed on the first data using the second decoder, the first decoding operation is performed on the second data using the first decoder, the second decoding operation is performed on the third data using a fourth decoder, and the first decoding operation is performed on the fourth data using the third decoder.

In the sixth time period, the first data is unloaded from the first buffer, the second decoding operation is performed on the second data using the second decoder, the first decoding operation is performed on the third data using the third decoder, and the second decoding operation is performed on the fourth data using the fourth decoder.

In the seventh time period, fifth data is loaded in the first buffer, the second data is unloaded from the second buffer, the second decoding operation is performed on the third data using the fourth decoder, and the first decoding operation is performed on the fourth data using the third decoder.

As shown in time periods seven through twelve, after the initialization of the four buffers, operations will take place on all four buffers in each time period. This embodiment allows for continuous streaming of data from a storage medium at ⅔ bandwidth while performing at most 2 full iterations (C2/C1/C2/C1) of decoding on the read data from the controller. Should additional iterations be desired and/or required due to unsuccessful decoding, the storage medium continues to be read at slower speed, and N more iterations of C2/C1/C2/C1 decoding, or some portion thereof, may be performed, such as N more iterations of C2/C1/C2 decoding, N more iterations of C1/C2/C1 decoding, N more iterations of C1/C2 decoding, etc., with N being a positive integer of not less than 1, such as 2, 3, 4, etc.

Now referring to FIG. 15, four buffers, Buffer 1, Buffer 2, Buffer 3, and Buffer 4 may be utilized during a plurality of sequential or consecutive time periods (denoted by the columns in the table) in order to perform iterative decoding comprising at least 2½ full iterations (C2/C1/C2/C1/C2) at 4/7 bandwidth. Each time period may include a sufficient amount of time to perform a decoding operation (C1 or C2), whichever takes longer, on data stored in each buffer, with the assumption that decoding operations take longer than loading and unloading operations.

For the remainder of the descriptions of FIG. 15, a first decoding operation refers to C2 decoding, a second decoding operation refers to C1 decoding, a first decoder refers to a C2 decoder, a second decoder refers to a C1 decoder, a third decoder refers to a second C2 decoder (denoted as C2'), and a fourth decoder refers to a second C1 decoder (denoted as C1'). However, in an alternate embodiment not described in detail here, a first decoding operation may refer to C1 decoding, a second decoding operation may refer to C2 decoding, a first decoder may refer to a C1 decoder, a second decoder may refer to a C2 decoder, a third decoder may refer to a second C1 decoder (denoted as C1'), and a fourth decoder may refer to a second C2 decoder (denoted as C2').

In other words, the first decoding operation and second decoding operation are uniquely selected from a group consisting of: a C1 decoding operation and a C2 decoding operation, such that when the first decoding operation is a C2 decoding operation, the second decoding operation is a C1 decoding operation. Conversely, when the first decoding operation is a C1 decoding operation, the second decoding operation is a C2 decoding operation.

As shown, first data (such as a first SDS, codeword, or some other portion of encoded data) is loaded into the first buffer during a first time period. When the interposer is being initialized, no other buffers will have any data stored therein, and no other operations will take place during the initialization phase in the first time period.

In the second time period, second data is loaded into the second buffer and a first decoding operation is performed on the first data using a first decoder.

Thereafter, during the third time period, third data is loaded into the third buffer, the first decoding operation is performed on the second data using the first decoder, and a second decoding operation is performed on the first data using a second decoder.

In the fourth time period, the first decoding operation is performed on the first data using the first decoder, the second decoding operation is performed on the second data using the second decoder, the first decoding operation is performed on the third data using a third decoder, and fourth data is loaded into the fourth buffer.

In the fifth time period, the second decoding operation is performed on the first data using the second decoder, the first decoding operation is performed on the second data using the first decoder, the second decoding operation is performed on the third data using a fourth decoder, and the first decoding operation is performed on the fourth data using the third decoder.

In the sixth time period, the first decoding operation is performed on the first data using the first decoder, the second decoding operation is performed on the second data using the second decoder, the first decoding operation is performed on the third data using the third decoder, and the second decoding operation is performed on the fourth data using the fourth decoder.

In the seventh time period, the first data is unloaded from the first buffer, the first decoding operation is performed on the second data using the first decoder, the second decoding operation is performed on the third data using the fourth decoder, and the first decoding operation is performed on the fourth data using the third decoder.

Then, in the eighth time period, fifth data is loaded into the first buffer, the second data is unloaded from the second buffer, the first decoding operation is performed on the third data using the third decoder, and the second decoding operation is performed on the fourth data using the fourth decoder.

As shown in time periods eight through fourteen, after the initialization of the four buffers, operations will take place on all four buffers in each time period. This embodiment allows for continuous streaming of data from a storage medium at 4/5 bandwidth while performing at most 2½ full iterations (C2/C1/C2/C1/C2) of decoding on the read data from the controller. Should additional iterations be desired and/or required due to unsuccessful decoding, the storage medium continues to be read at slower speed, and N more iterations of C2/C1/C2/C1/C2, or any portion thereof, may be performed, such as N iterations of C1/C2 decoding, N iterations of C2/C1/C2/C1 decoding, etc., with N being a positive integer of not less than 1, such as 2, 3, 4, etc.

Figure 16:
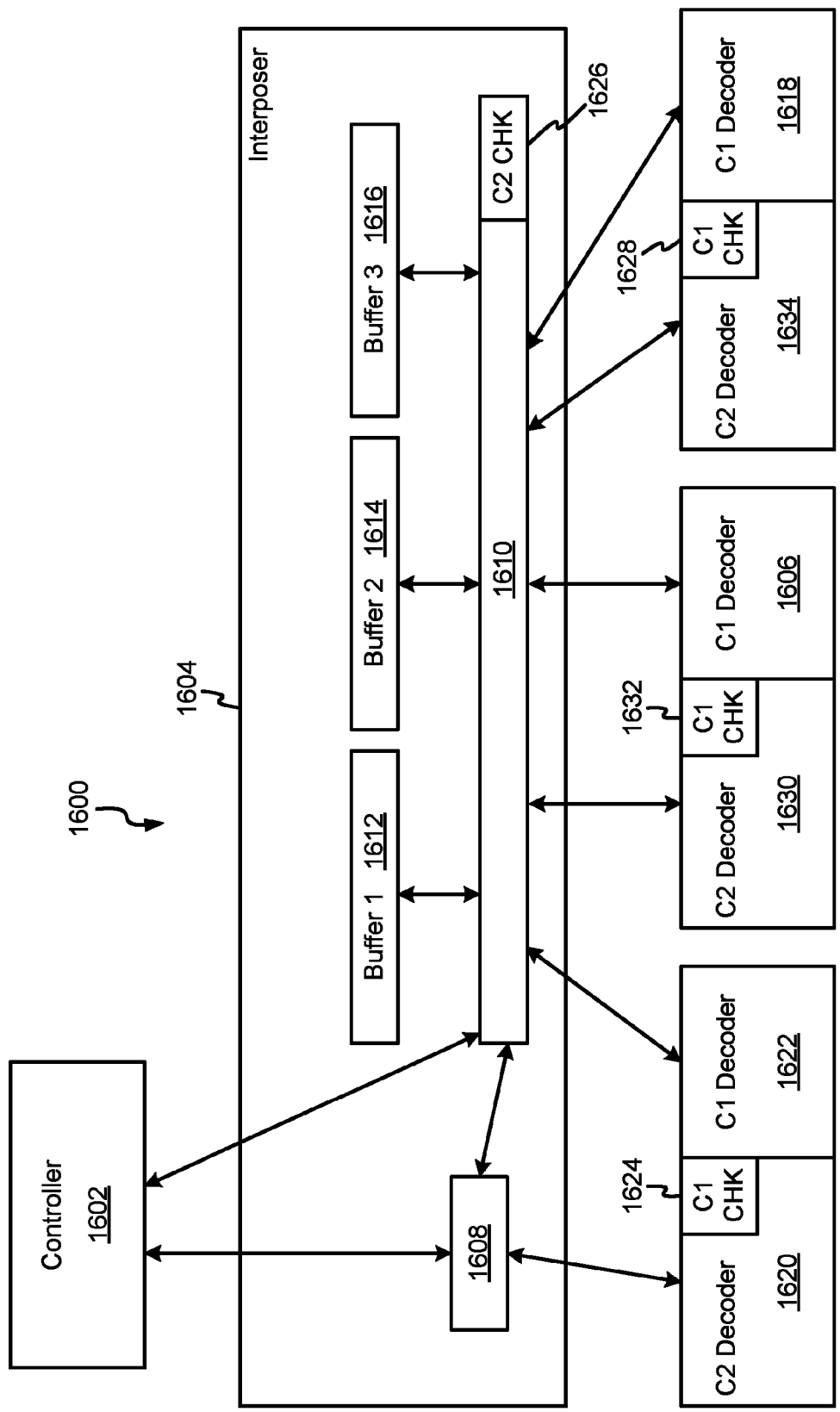
FIG. 16 shows an architecture for iterative decoding, according to one embodiment.

Now referring to FIG. 16, another embodiment of an architecture 1600 for iterative decoding is shown according to one embodiment. In this architecture 1600, a controller 1602 is in electrical communication with an interposer 1604. The interposer 1604 comprises a multiplexer 1608 in electrical communication with the controller 1602 and a buffer memory interface 1610, which is configured to store and retrieve data using a plurality of discrete hardware buffers (in architecture 1600, three buffers are included: Buffer 1 1612, Buffer 2 1614, and Buffer 3 1616).

The electrical connection between the controller 1602 and the multiplexer 1608 may be the legacy connection that is used in conventional tape drives to connect the buffer manager to the C2 decoder 1620, according to one embodiment, and as described in FIG. 5.

Referring again to FIG. 16, the interposer 1604 also comprises a C2 syndrome check module 1626 configured to perform a C2 syndrome check on data received from any of the C1 decoders 1606, 1618, 1622 after having C1 decoding performed thereon, in one embodiment. The first C1 decoder 1622 is in electrical communication with the interposer 1604, and Buffer 1 1612, in one embodiment. The second C1 decoder 1606 is in electrical communication with the interposer 1604 and Buffer 2 1614, in one embodiment. The third C1 decoder 1618 is in electrical communication with the interposer 1604 and Buffer 3 1616, in one embodiment.

The C2 decoder 1620 comprises a C1 syndrome check module 1624 configured to perform a C1 syndrome check on data that has been C2 decoded by the C2 decoder 1620, in one embodiment. Moreover, a second C2 decoder 1630 is in electrical communication with the interposer 1604 and the second buffer 1614 and comprises a C1 syndrome check module 1632 configured to perform a C1 syndrome check on data that has been C2 decoded by the C2 decoder 1630, in one embodiment. Also, a third C2 decoder 1634 is in electrical communication with the interposer 1604 and the third buffer 1616 and comprises a C1 syndrome check module 1628 configured to perform a C1 syndrome check on data that has been C2 decoded by the C2 decoder 1634, in one embodiment.

The use of the plurality of discrete buffer memories (e.g., Buffer 1 1612, Buffer 2 1614, and Buffer 3 1616) during iterative decoding may take place using schemes described herein according to various embodiments adjusted for use with three buffers, instead of four or five as previously described, as would be understood by one of skill in the art upon reading the present descriptions.

Table 1 shows a comparison between the various architectures shown in FIGS. 5, 6, 9, 11, and 16.

TABLE 1

| Architecture | Decoding Power | Relative Size | Latency | Maximum Bandwidth |
|---|---|---|---|---|
| FIG. 5 | C2 | 1 | 0 SDS | Full |
| FIG. 6 | C2/C1 | 6 | 3 SDS | Full |
| FIG. 9 | C2/C1/C2 | 8 | 4 SDS | Full |
| FIG. 11 | 2:1 Dedicated C2/C1 Pairs | 8 | 2 + N SDS | 4/5 |
| FIG. 16 | 1:1 Dedicated C2/C1 Pairs | 9 | 2 + N SDS | 3/5 |

As shown, the baseline decoding power (number of baseline iterations possible without stopping the storage medium from being read) for each architecture grows as the complexity of the architecture (represented by the relative size, with a single C2 decoder in FIG. 5 being represented by 1, and two additional C2 decoders, three additional C1 decoders, three buffers, and the interposer in FIG. 16 being represented by 9). The relative latencies for each architecture is also shown, with a number of iterations being represented by N. The bandwidth possible, which dictates the speed at which the storage medium may be read, is also shown, along with a flexibility in adding additional iterations on the fly without having to make microcode alterations to the tape drive.

Figure 17:
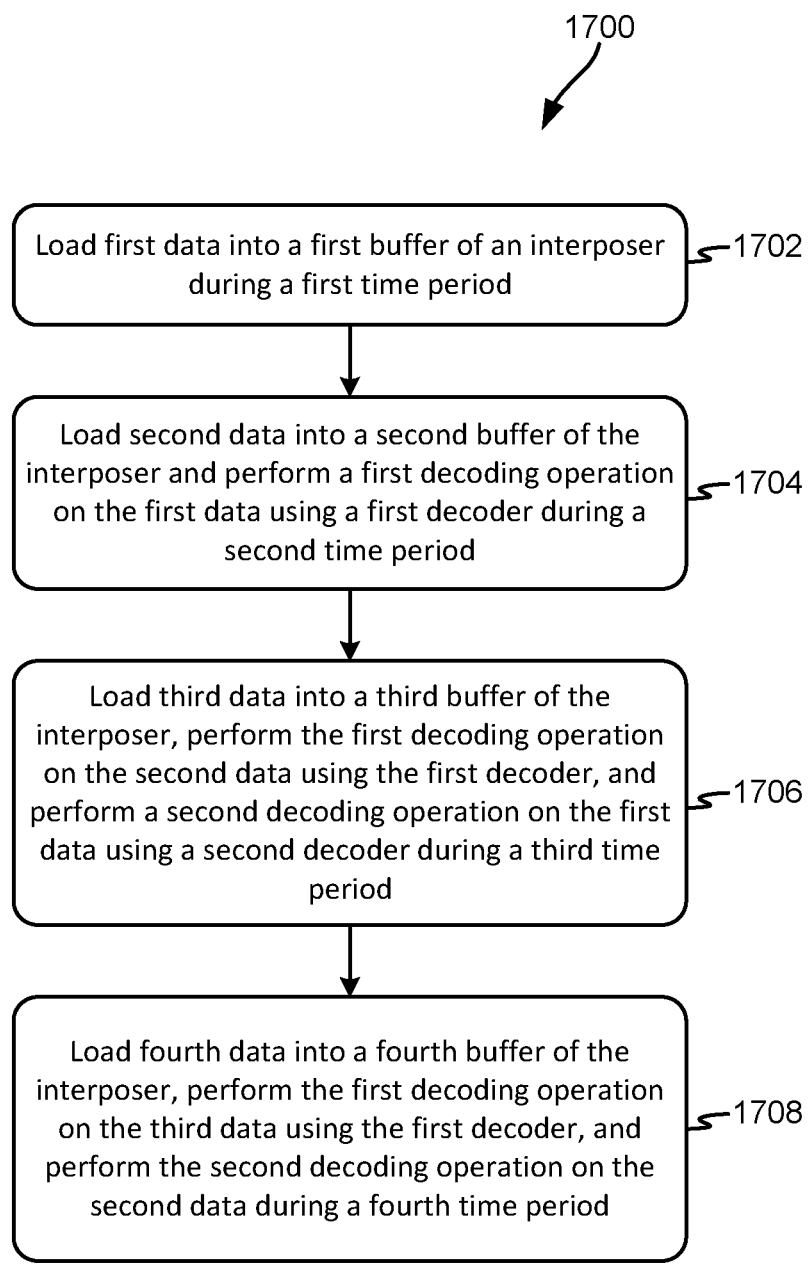
FIG. 17 shows a flowchart of a method, according to one embodiment.

Now referring to FIG. 17, a method 1700 is shown according to one embodiment. The method 1700 may be performed in accordance with the present invention in any of the environments depicted in FIGS. 1-16, among others, in various embodiments. Of course, more or less operations than those specifically described in FIG. 17 may be included in method 1700, as would be understood by one of skill in the art upon reading the present descriptions.

Each of the steps of the method 1700 may be performed by any suitable component of the operating environment. For example, in various embodiments, the method 1700 may be partially or entirely performed by a controller, a processor, a tape drive, or some other device having one or more processors therein. The processor, e.g., processing circuit(s), chip(s), and/or module(s) implemented in hardware and/or software, and preferably having at least one hardware component, may be utilized in any device to perform one or more steps of the method 1700. Illustrative processors include, but are not limited to, a CPU, an ASIC, a FPGA, etc., combinations thereof, or any other suitable computing device known in the art.

As shown in FIG. 17, method 1700 may start with operation 1702, where first data is loaded into a first buffer of an interposer during a first time period. First data may be a SDS or some other portion of data read from or received by a tape drive or some other suitable system for decoding encoded data stored to a storage medium. By loading data, what is meant is that data is stored in the buffer for use in subsequent operations.

In operation 1704, during a second time period: second data is loaded into a second buffer and a first decoding operation is performed on the first data using a first decoder. The first decoder may be accessible to the interposer and/or a controller, and/or it may be integrated with the interposer.

In operation 1706, during a third time period: third data is loaded into the third buffer, the first decoding operation is performed on the second data using the first decoder, and a second decoding operation is performed on the first data using a second decoder.

In operation 1708, during a fourth time period: fourth data is loaded into the fourth buffer, the first decoding operation is performed on the third data using the first decoder, and the second decoding operation is performed on the second data.

In the description of method 1700, the first decoding operation and the second decoding operation are uniquely selected from a group consisting of: a C1 decoding operation and a C2 decoding operation. The C1 decoding operation is configured to decode a C1 codeword, which is stored in a product codeword orthogonally to C2 codewords. The C2 decoding operation is configured to decode a C2 codeword from the product codeword.

In one embodiment, method 1700 may further include unloading the first data from the first buffer during the fourth time period as well as the following actions: performing the second decoding operation on the second data using the second decoder and the first decoding operation on the third data using the first decoder. An example of a pipeline for use of the buffers in this embodiment is shown in FIG. 7 according to one embodiment. By unloading data, what is meant is that the data in the buffer is read and transferred to some other storage device or memory, and the buffer is freed to be used to store other data.

Referring again to FIG. 17, in another embodiment, method 1700 may further include during the fourth time period: performing the second decoding operation on the second data using the second decoder, and performing the first decoding operation on the third data using the first decoder. Also, method 1700 may include during a fifth time period: performing the second decoding operation on the third data using the second decoder, and performing the first decoding operation on the fourth data using the first decoder. Moreover, method 1700 may include during a sixth time period: performing the first decoding operation on the first data using the first decoder, and performing the second decoding operation on the fourth data using the second decoder. Furthermore, method 1700 may include during a seventh time period: performing the second decoding operation on the first data using the second decoder, and performing the first decoding operation on the second data using the first decoder. In addition, method 1700 may include during an eighth time period: unloading the first data from the first buffer, performing the second decoding operation on the second data using the second decoder, and performing the first decoding operation on the third data using the first decoder. In this embodiment, no data is loaded into any of the plurality of buffers during the fifth, sixth, seventh, and eighth time periods. An example of a pipeline for use of the buffers in this embodiment is shown in FIG. 8 according to one embodiment.

Referring again to FIG. 17, in another embodiment, a fifth buffer may be used, and the method 1700 may further include during the fourth time period: performing the first decoding operation on the first data using a third decoder (a second decoder configured to perform first decoding operations), performing the second decoding operation on the second data using the second decoder, and performing the first decoding operation on the third data using the first decoder. Additionally, the method 1700 may include, during a fifth time period: unloading the first data from the first buffer, performing the first decoding operation on the second data using the third decoder, performing the second decoding operation on the third data using the second decoder, performing the first decoding operation on the fourth data using the first decoder, and loading fifth data into the fifth buffer during a fifth time period. An example of a pipeline for use of the buffers in this embodiment is shown in FIG. 10 according to one embodiment.

Referring again to FIG. 17, in another embodiment, the method 1700 may further include during the fourth time period: unloading the first data from the first buffer, performing the second decoding operation on the second data using the second decoder, and performing the first decoding operation on the third data using a third decoder. In a fifth time period, method 1700 may include loading fifth data into the first buffer, unloading the second data from the second buffer, performing the second decoding operation on the third data using a fourth decoder, and performing the first decoding operation on the fourth data using the third decoder during a fifth time period. An example of a pipeline for use of the buffers in this embodiment is shown in FIG. 12 according to one embodiment.

Referring again to FIG. 17, in another embodiment, method 1700 may further include during the fourth time period: performing the first decoding operation on the first data using the first decoder, performing the second decoding operation on the second data using the second decoder, and performing the first decoding operation on the third data using a third decoder. In a fifth time period, method 1700 may include unloading the first data from the first buffer, performing the first decoding operation on the second data using the first decoder, performing the second decoding operation on the third data using a fourth decoder, and performing the first decoding operation on the fourth data using the third decoder. In a sixth time period, method 1700 may include loading fifth data into the first buffer, unloading the second data from the second buffer, performing the first decoding operation on the third data using the third decoder, and performing the second decoding operation on the fourth data using the fourth decoder. An example of a pipeline for use of the buffers in this embodiment is shown in FIG. 13 according to one embodiment. In this embodiment, no data is loaded into any of the plurality of buffers during the fifth time period.

Referring again to FIG. 17, in another embodiment, method 1700 may further include during the fourth time period: performing the first decoding operation on the first data using the first decoder, performing the second decoding operation on the second data using the second decoder, and performing the first decoding operation on the third data using a third decoder. In a fifth time period, method 1700 may include performing the second decoding operation on the first data using the second decoder, performing the first decoding operation on the second data using the first decoder, performing the second decoding operation on the third data using a fourth decoder, and performing the first decoding operation on the fourth data using the third decoder. In a sixth time period, method 1700 may include unloading the first data from the first buffer, performing the second decoding operation on the second data using the second decoder, performing the first decoding operation on the third data using the third decoder, and performing the second decoding operation on the fourth data using the fourth decoder. An example of a pipeline for use of the buffers in this embodiment is shown in FIG. 14 according to one embodiment. In this embodiment, no data is loaded into any of the plurality of buffers during the fifth and sixth time periods.

Referring again to FIG. 17, in another embodiment, method 1700 may further include during the fourth time period: performing the first decoding operation on the first data using the first decoder, performing the second decoding operation on the second data using the second decoder, and performing the first decoding operation on the third data using a third decoder. In a fifth time period, method 1700 may include performing the second decoding operation on the first data using the second decoder, performing the first decoding operation on the second data using the first decoder, performing the second decoding operation on the third data using a fourth decoder, and performing the first decoding operation on the fourth data using the third decoder. In a sixth time period, method 1700 may include performing the first decoding operation on the first data using the first decoder, performing the second decoding operation on the second data using the second decoder, performing the first decoding operation on the third data using the third decoder, and performing the second decoding operation on the fourth data using the fourth decoder. In a seventh time period, method 1700 may include unloading the first data from the first buffer, performing the first decoding operation on the second data using the first decoder, performing the second decoding operation on the third data using the fourth decoder, and performing the first decoding operation on the fourth data using the third decoder. An example of a pipeline for use of the buffers in this embodiment is shown in FIG. 15 according to one embodiment. In this embodiment, no data is loaded into any of the plurality of buffers during the fifth, sixth, and seventh time periods.

Figure 18:
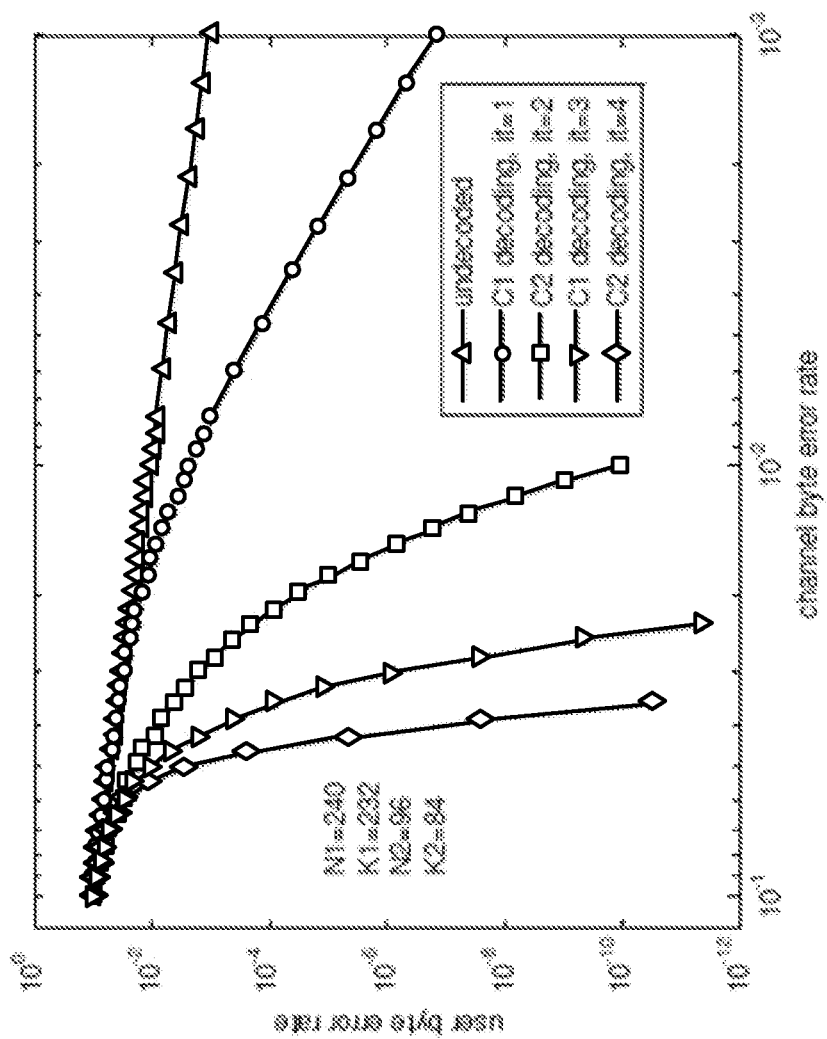
FIG. 18 shows a comparison of error rate performance for decoding encoded data using a different number of decoding iterations.

Now referring to FIG. 18, a comparison of error rate performance for decoding encoded data using a different number of decoding iterations is shown. The decoders for this exemplary chart used a C1 code of RS(N1,K1) and a C2 code of RS(N2,K2) with the following parameters: N1=240, K1=232, N2=96, and K2=84. The error rate performance shown in this chart further assumes that the byte stream at the input of the first decoding operation (in this case a C1 decoding operation) exhibits uncorrelated byte errors. As can be seen from the chart in FIG. 18, as the number of half iterations (it) increases (e.g., from one half iteration to two full iterations), the channel byte error rate is reduced. Therefore, on average, the more iterations that are performed in iterative decoding, the better the error rate performance will be for decoding the encoded data up to some limit of improved performance. Therefore, it is beneficial to determine where diminishing returns are optimized in respect to latency that is introduced in the data reading and decoding due to increased iterations.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an ASIC, a FPGA, etc. By executable by the processor, what is meant is that the logic is hardware logic; software logic such as firmware, part of an operating system, part of an application program, etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a CPU, an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A system, comprising:
   a plurality of discrete hardware buffers configured to store data during different stages of iterative decoding, the plurality of buffers comprising: a first buffer, a second buffer, a third buffer, and a fourth buffer; and
   a controller and logic integrated with and/or executable by the controller, the logic being configured to cause the controller to:
      load first data into the first buffer during a first time period;
      load second data into the second buffer and perform a first decoding operation on the first data using a first decoder during a second time period;
      load third data into the third buffer, perform the first decoding operation on the second data using the first decoder, and perform a second decoding operation on the first data using a second decoder during a third time period; and
      load fourth data into the fourth buffer, perform the first decoding operation on the third data using the first decoder, and perform the second decoding operation on the second data during a fourth time period,
      wherein the first decoding operation and second decoding operation are uniquely selected from a group consisting of: a C1 decoding operation and a C2 decoding operation.

2. The system as recited in claim 1, wherein the logic is further configured to cause the controller to:
   unload the first data from the first buffer, perform the second decoding operation on the second data using the second decoder, and perform the first decoding operation on the third data using the first decoder during the fourth time period.

3. The system as recited in claim 1, wherein the plurality of buffers further comprises a fifth buffer, and wherein the logic is further configured to cause the controller to:
   perform the first decoding operation on the first data using a third decoder, perform the second decoding operation on the second data using the second decoder, and perform the first decoding operation on the third data using the first decoder during the fourth time period; and
   unload the first data from the first buffer, perform the first decoding operation on the second data using the third decoder, perform the second decoding operation on the third data using the second decoder, perform the first decoding operation on the fourth data using the first decoder, and load fifth data into the fifth buffer during a fifth time period.

4. The system as recited in claim 1, wherein the logic is further configured to cause the controller to:
   unload the first data from the first buffer, perform the second decoding operation on the second data using the second decoder, and perform the first decoding operation on the third data using a third decoder during the fourth time period; and load fifth data into the first buffer, unload the second data from the second buffer, perform the second decoding operation on the third data using a fourth decoder, and perform the first decoding operation on the fourth data using the third decoder during a fifth time period, wherein the first time period is after the second time period, wherein the third time period is after the second time period, and wherein the fourth time period is after the third time period.

5. The system as recited in claim 1, wherein the logic is further configured to cause the controller to:

perform the first decoding operation on the first data using a third decoder, perform the second decoding operation on the second data using the second decoder, and perform the first decoding operation on the third data using a third decoder during the fourth time period;

unload the first data from the first buffer, perform the first decoding operation on the second data using the first decoder, perform the second decoding operation on the third data using a fourth decoder, and perform the first decoding operation on the fourth data using the third decoder during a fifth time period; and load fifth data into the first buffer, unload the second data from the second buffer, perform the first decoding operation on the third data using the third decoder, and perform the second decoding operation on the fourth data using the fourth decoder during a sixth time period, and wherein no data is loaded into any of the plurality of buffers during the fifth time period.

6. The system as recited in claim 1, wherein the logic is further configured to cause the controller to:

perform the first decoding operation on the first data using the first decoder, perform the second decoding operation on the second data using the second decoder, and perform the first decoding operation on the third data using a third decoder during the fourth time period;

perform the second decoding operation on the first data using the second decoder, perform the first decoding operation on the second data using the first decoder, perform the second decoding operation on the third data using a fourth decoder, and perform the first decoding operation on the fourth data using the third decoder during a fifth time period; and unload the first data from the first buffer, perform the second decoding operation on the second data using the second decoder, perform the first decoding operation on the third data using the third decoder, and perform the second decoding operation on the fourth data using the fourth decoder during a sixth time period, and wherein no data is loaded into any of the plurality of buffers during the fifth and sixth time periods.

7. The system as recited in claim 1, wherein the logic is further configured to cause the controller to:

perform the first decoding operation on the first data using the first decoder, perform the second decoding operation on the second data using the second decoder, and perform the first decoding operation on the third data using a third decoder during the fourth time period;

perform the second decoding operation on the first data using the second decoder, perform the first decoding operation on the second data using the first decoder, perform the second decoding operation on the fourth data using a fourth decoder, and perform the first decoding operation on the fourth data using the third decoder during a fifth time period;

perform the first decoding operation on the first data using the first decoder, perform the second decoding operation on the second data using the second decoder, perform the first decoding operation on the third data using the third decoder, and perform the second decoding operation on the fourth data using the fourth decoder during a sixth time period; and unload the first data from the first buffer, perform the first decoding operation on the second data using the first decoder, perform the second decoding operation on the third data using the fourth decoder, and perform the first decoding operation on the fourth data using the third decoder during a seventh time period, and wherein no data is loaded into any of the plurality of buffers during the fifth, sixth, and seventh time periods.

8. The system as recited in claim 1, wherein the logic is further configured to cause the controller to:

perform the second decoding operation on the second data using the second decoder, and perform the first decoding operation on the third data using the first decoder during the fourth time period;

perform the second decoding operation on the third data using the second decoder, and perform the first decoding operation on the fourth data using the first decoder during a fifth time period;

perform the first decoding operation on the first data using the first decoder, and perform the second decoding operation on the fourth data using the second decoder during a sixth time period;

perform the second decoding operation on the first data using the second decoder, and perform the first decoding operation on the second data using the first decoder during a seventh time period; and unload the first data from the first buffer, perform the second decoding operation on the second data using the second decoder, and perform the first decoding operation on the third data using the first decoder during an eighth time period, and wherein no data is loaded into any of the plurality of buffers during the fifth, sixth, seventh, and eighth time periods.

9. A controller-implemented method, the method comprising:

loading first data into a first buffer of an interposer during a first time period;

loading second data into a second buffer of the interposer and performing a first decoding operation on the first data using a first decoder during a second time period;

loading third data into a third buffer of the interposer, performing the first decoding operation on the second data using the first decoder, and performing a second decoding operation on the first data using a second decoder during a third time period; and loading fourth data into a fourth buffer of the interposer, performing the first decoding operation on the third data using the first decoder, and performing the second decoding operation on the second data during a fourth time period, and wherein the first decoding operation and second decoding operation are uniquely selected from a group consisting of: a C1 decoding operation and a C2 decoding operation.

10. The method as recited in claim 9, further comprising:
unloading the first data from the first buffer during the first time period; and performing the second decoding operation on the second data using the second decoder and performing the first decoding operation on the third data using the first decoder during the fourth time period.

11. The method as recited in claim 9, further comprising:
performing the first decoding operation on the first data using a third decoder, performing the second decoding operation on the second data using the second decoder, and performing the first decoding operation on the third data using the first decoder during the fourth time period; and
unloading the first data from the first buffer, performing the first decoding operation on the second data using the third decoder, performing the second decoding operation on the third data using the second decoder, performing the first decoding operation on the fourth data using the first decoder, and loading fifth data into a fifth buffer during a fifth time period.

12. The method as recited in claim 9, further comprising:
unloading the first data from the first buffer, performing the second decoding operation on the second data using the second decoder, and performing the first decoding operation on the third data using a third decoder during the fourth time period; and
loading fifth data into the first buffer, unloading the second data from the second buffer, performing the second decoding operation on the third data using a fourth decoder, and performing the first decoding operation on the fourth data using the third decoder during a fifth time period.

13. The method as recited in claim 9, further comprising:
performing the first decoding operation on the first data using a third decoder, performing the second decoding operation on the second data using the second decoder, and performing the first decoding operation on the third data using a third decoder during the fourth time period;
unloading the first data from the first buffer, performing the first decoding operation on the second data using the first decoder, performing the second decoding operation on the third data using a fourth decoder, and performing the first decoding operation on the fourth data using the third decoder during a fifth time period; and
loading fifth data into the first buffer, unloading the second data from the second buffer, performing the first decoding operation on the third data using the third decoder, and performing the second decoding operation on the fourth data using the fourth decoder during a sixth time period,
wherein no data is loaded into any buffer during the fifth time period.

14. The method as recited in claim 9, further comprising:
performing the first decoding operation on the first data using the first decoder, performing the second decoding operation on the second data using the second decoder, and performing the first decoding operation on the third data using a third decoder during the fourth time period;
performing the second decoding operation on the first data using the second decoder, performing the first decoding operation on the second data using the first decoder, performing the second decoding operation on the third data using a fourth decoder, and performing the first decoding operation on the fourth data using the third decoder during a fifth time period; and
unloading the first data from the first buffer, performing the second decoding operation on the second data using the second decoder, performing the first decoding operation on the third data using the third decoder, and performing the second decoding operation on the fourth data using the fourth decoder during a sixth time period,
wherein no data is loaded into any buffer during the fifth and sixth time periods.

15. The method as recited in claim 9, further comprising:
performing the first decoding operation on the first data using the first decoder, performing the second decoding operation on the second data using the second decoder, and performing the first decoding operation on the third data using a third decoder during the fourth time period;
performing the second decoding operation on the first data using the second decoder, performing the first decoding operation on the second data using the first decoder, performing the second decoding operation on the fourth data using a fourth decoder, and performing the first decoding operation on the fourth data using the third decoder during a fifth time period;
performing the first decoding operation on the first data using the first decoder, performing the second decoding operation on the second data using the second decoder, performing the first decoding operation on the third data using the third decoder, and performing the second decoding operation on the fourth data using the fourth decoder during a sixth time period; and
unloading the first data from the first buffer, perform the first decoding operation on the second data using the first decoder, performing the second decoding operation on the third data using the fourth decoder, and performing the first decoding operation on the fourth data using the third decoder during a seventh time period,
wherein no data is loaded into any buffer during the fifth, sixth, and seventh time periods.

16. The method as recited in claim 9, further comprising:
performing the second decoding operation on the second data using the second decoder, and performing the first decoding operation on the third data using the first decoder during the fourth time period;
performing the second decoding operation on the third data using the second decoder, and performing the first decoding operation on the fourth data using the first decoder during a fifth time period;
performing the first decoding operation on the first data using the first decoder, and performing the second decoding operation on the fourth data using the second decoder during a sixth time period;
performing the second decoding operation on the first data using the second decoder, and performing the first decoding operation on the second data using the first decoder during a seventh time period; and
unloading the first data from the first buffer, performing the second decoding operation on the second data using the second decoder, and performing the first decoding operation on the third data using the first decoder during an eighth time period,
wherein no data is loaded into any buffer during the fifth, sixth, seventh, and eighth time periods.

17. A computer program product, the computer program product comprising a computer readable storage medium having program instructions embodied therewith, the embodied program instructions being executable by a controller to cause the controller to:
  load, by the controller, first data into a first buffer of an interposer during a first time period;
  load, by the controller, second data into a second buffer of the interposer and perform a first decoding operation on the first data using a first decoder during a second time period;
  load, by the controller, third data into a third buffer, perform the first decoding operation on the second data using the first decoder, and perform a second decoding operation on the first data using a second decoder during a third time period; and
  load, by the controller, fourth data into a fourth buffer, perform the first decoding operation on the third data using the first decoder, and perform the second decoding operation on the second data during a fourth time period,
  wherein the first decoding operation and second decoding operation are uniquely selected from a group consisting of: a C1 decoding operation and a C2 decoding operation.

18. The computer program product as recited in claim 17, wherein the embodied program instructions are further executable by the controller to cause the controller to:
  unload, by the controller, the first data from the first buffer during the first time period; and
  perform the second decoding operation on the second data using the second decoder and the first decoding operation on the third data using the first decoder during the fourth time period.

19. The computer program product as recited in claim 17, wherein the embodied program instructions are further executable by the controller to cause the controller to:
  perform the first decoding operation on the first data using a third decoder, perform the second decoding operation on the second data using the second decoder, and perform the first decoding operation on the third data using the first decoder during the fourth time period; and
  unload, by the controller, the first data from the first buffer, perform the first decoding operation on the second data using the third decoder, perform the second decoding operation on the third data using the second decoder, perform the first decoding operation on the fourth data using the first decoder, and load fifth data into a fifth buffer during a fifth time period.

20. The computer program product as recited in claim 17, wherein the embodied program instructions are further executable by the controller to cause the controller to:
  unload, by the controller, the first data from the first buffer, perform the second decoding operation on the second data using the second decoder, and perform the first decoding operation on the third data using a third decoder during the fourth time period; and
  load, by the controller, fifth data into the first buffer, unload the second data from the second buffer, perform the second decoding operation on the third data using a fourth decoder, and perform the first decoding operation on the fourth data using the third decoder during a fifth time period.

21. The computer program product as recited in claim 17, wherein the embodied program instructions are further executable by the controller to cause the controller to:
  perform the first decoding operation on the first data using a third decoder, perform the second decoding operation on the second data using the second decoder, and perform the first decoding operation on the third data using a third decoder during the fourth time period;
  unload, by the controller, the first data from the first buffer, perform the first decoding operation on the second data using the first decoder, perform the second decoding operation on the third data using a fourth decoder, and perform the first decoding operation on the fourth data using the third decoder during a fifth time period; and
  load, by the controller, fifth data into the first buffer, unload the second data from the second buffer, perform the first decoding operation on the third data using the third decoder, and perform the second decoding operation on the fourth data using the fourth decoder during a sixth time period, and
  wherein no data is loaded into any buffer during the fifth time period.

22. The computer program product as recited in claim 17, wherein the embodied program instructions are further executable by the controller to cause the controller to:
  perform the first decoding operation on the first data using the first decoder, perform the second decoding operation on the second data using the second decoder, and perform the first decoding operation on the third data using a third decoder during the fourth time period;
  perform the second decoding operation on the first data using the second decoder, perform the first decoding operation on the second data using the first decoder, perform the second decoding operation on the third data using a fourth decoder, and perform the first decoding operation on the fourth data using the third decoder during a fifth time period; and
  unload, by the controller, the first data from the first buffer, perform the second decoding operation on the second data using the second decoder, perform the first decoding operation on the third data using the third decoder, and perform the second decoding operation on the fourth data using the fourth decoder during a sixth time period, and
  wherein no data is loaded into any buffer during the fifth and sixth time periods.

23. The computer program product as recited in claim 17, wherein the embodied program instructions are further executable by the controller to cause the controller to:
  perform the first decoding operation on the first data using the first decoder, perform the second decoding operation on the second data using the second decoder, and perform the first decoding operation on the third data using a third decoder during the fourth time period;
  perform the second decoding operation on the first data using the second decoder, perform the first decoding operation on the second data using the first decoder, perform the second decoding operation on the fourth data using a fourth decoder, and perform the first decoding operation on the fourth data using the third decoder during a fifth time period;
  perform the first decoding operation on the first data using the first decoder, perform the second decoding operation on the second data using the second decoder, perform the first decoding operation on the third data using the third decoder, and perform the second decoding operation on the fourth data using the fourth decoder during a sixth time period; and
  unload, by the controller, the first data from the first buffer, perform the first decoding operation on the second data using the first decoder, perform the second decoding operation on the third data using the fourth decoder, and perform the first decoding operation on the fourth data using the third decoder during a seventh time period, and wherein no data is loaded into any buffer during the fifth, sixth, and seventh time periods.

24. The computer program product as recited in claim 17, wherein the embodied program instructions are further executable by the controller to cause the controller to:

perform the second decoding operation on the second data using the second decoder, and perform the first decoding operation on the third data using the first decoder during the fourth time period;

perform the second decoding operation on the third data using the second decoder, and perform the first decoding operation on the fourth data using the first decoder during a fifth time period;

perform the first decoding operation on the first data using the first decoder, and perform the second decoding operation on the fourth data using the second decoder during a sixth time period;

perform the second decoding operation on the first data using the second decoder, and perform the first decoding operation on the second data using the first decoder during a seventh time period; and unload, by the controller, the first data from the first buffer, perform the second decoding operation on the second data using the second decoder, and perform the first decoding operation on the third data using the first decoder during an eighth time period, and wherein no data is loaded into any buffer during the fifth, sixth, seventh, and eighth time periods.

\* \* \* \* \*